United States Patent
Tsukamoto

(10) Patent No.: US 10,665,283 B2
(45) Date of Patent: May 26, 2020

(54) SEMICONDUCTOR STORAGE ELEMENT AND ELECTRONIC DEVICE

(71) Applicant: SONY CORPORATION, Tokyo (JP)

(72) Inventor: Masanori Tsukamoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/091,680

(22) PCT Filed: Feb. 24, 2017

(86) PCT No.: PCT/JP2017/007108
§ 371 (c)(1),
(2) Date: Oct. 5, 2018

(87) PCT Pub. No.: WO2017/179314
PCT Pub. Date: Oct. 19, 2017

(65) Prior Publication Data
US 2019/0156879 A1    May 23, 2019

(30) Foreign Application Priority Data

Apr. 13, 2016 (JP) .................. 2016-080397

(51) Int. Cl.
*G11C 11/00* (2006.01)
*G11C 11/22* (2006.01)
(Continued)

(52) U.S. Cl.
CPC ........... *G11C 11/223* (2013.01); *G11C 11/22* (2013.01); *H01L 27/1159* (2013.01); *H01L 27/11585* (2013.01); *H01L 27/11587* (2013.01)

(58) Field of Classification Search
None
See application file for complete search history.

(56) References Cited

U.S. PATENT DOCUMENTS 5,051,948 A    9/1991  Watabe et al.
6,069,816 A *  5/2000  Nishimura ............ G11C 14/00
                                              257/295

(Continued)

FOREIGN PATENT DOCUMENTS

CN    1434982 A      8/2003
DE    10037950 A1    3/2001
(Continued)

OTHER PUBLICATIONS

International Search Report and Written Opinion of PCT Application No. PCT/JP2017/007108, dated Apr. 4, 2017, 09 pages of English Translation and 08 pages of ISRWO.

(Continued)

*Primary Examiner* — Tan T. Nguyen
(74) *Attorney, Agent, or Firm* — Chip Law Group

(57) ABSTRACT

A semiconductor storage element includes a first transistor including a gate insulator film at least partially formed by a ferroelectric material, a second transistor connecting with a gate of the first transistor at one of a source or a drain, and a third transistor connecting with a drain of the first transistor at one of a source or a drain. The semiconductor storage element is arranged in a matrix, and each of the second and third transistors connects with a word line at a gate and connects with a bit line at another one of the source or the drain.

17 Claims, 15 Drawing Sheets

(51) Int. Cl.
  *H01L 27/11587* (2017.01)
  *H01L 27/1159* (2017.01)
  *H01L 27/11585* (2017.01)

(56) References Cited

U.S. PATENT DOCUMENTS

| | | | |
|---|---|---|---|
| 6,442,059 B1* | 8/2002 | Kang | G11C 11/22 |
| | | | 257/295 |
| 6,459,110 B1 | 10/2002 | Tani | |
| 2002/0182756 A1 | 12/2002 | Kang | |
| 2002/0190296 A1 | 12/2002 | Shimada | |
| 2007/0147151 A1* | 6/2007 | Kurokawa | H01L 21/8221 |
| | | | 365/205 |
| 2009/0290404 A1* | 11/2009 | Kaneko | G11C 11/22 |
| | | | 365/145 |

FOREIGN PATENT DOCUMENTS

| | | |
|---|---|---|
| EP | 1244144 A1 | 9/2002 |
| JP | 02-78098 A | 3/1990 |
| JP | 02-078098 A | 3/1990 |
| JP | 10-256494 A | 9/1998 |
| JP | 11-162160 A | 6/1999 |
| JP | 2001-043694 A | 2/2001 |
| JP | 2001-084759 A | 3/2001 |
| JP | 2001-168296 A | 6/2001 |
| JP | 2003-197869 A | 7/2003 |
| KR | 10-2001-0017949 A | 3/2001 |
| WO | 89/08314 A1 | 9/1989 |
| WO | 99/026252 A1 | 5/1999 |
| WO | 99/26252 A1 | 5/1999 |
| WO | 01/45161 A1 | 6/2001 |

OTHER PUBLICATIONS

International Preliminary Report on Patentability of PCT Application No. PCT /JP2017/007108, dated Oct. 25, 2018, 09 pages of English Translation and 06 pages of IPRP.

* cited by examiner

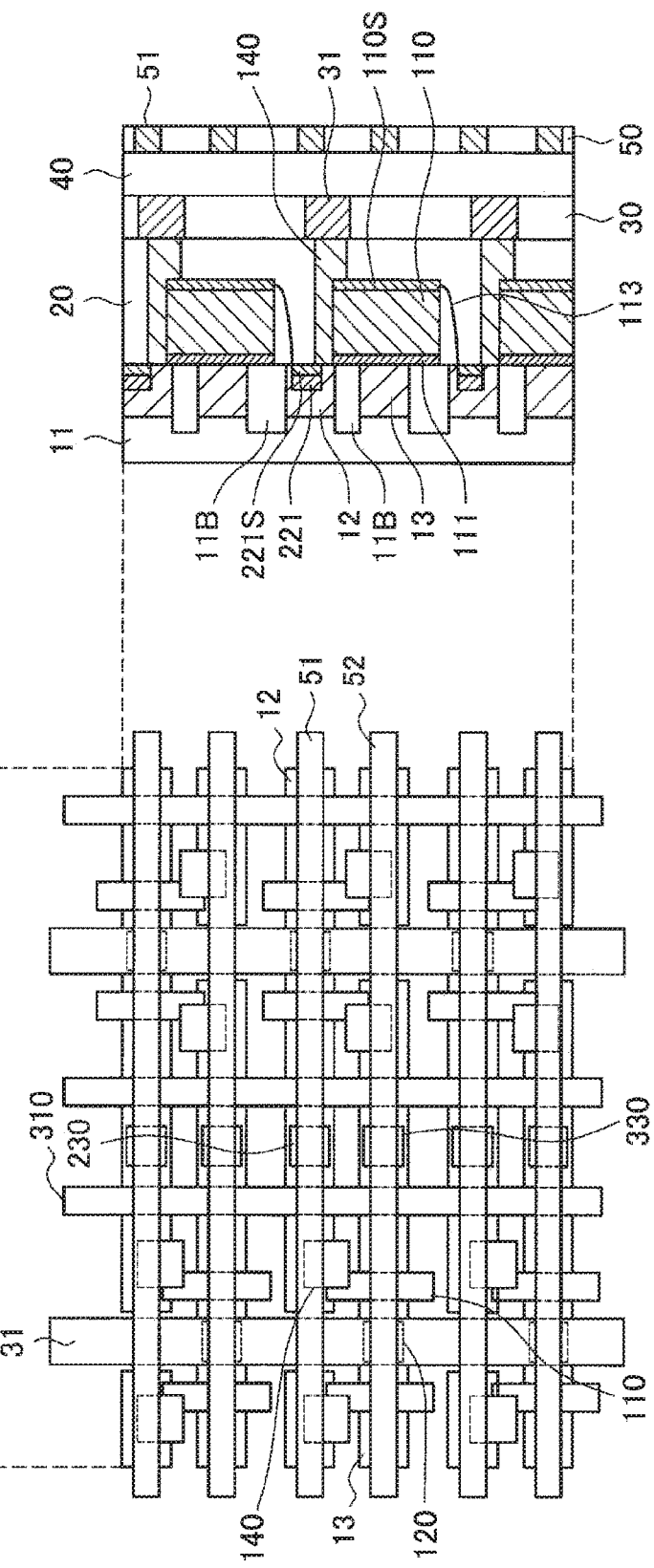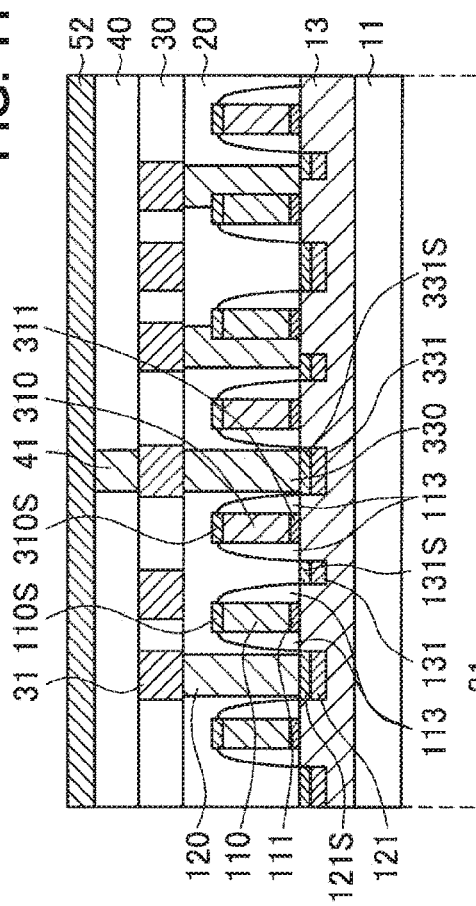
FIG. 11

2
SEMICONDUCTOR STORAGE ELEMENT AND ELECTRONIC DEVICE

CROSS REFERENCE TO RELATED APPLICATIONS

This application is a U.S. National Phase of International Patent Application No. PCT/JP2017/007108 filed on Feb. 24, 2017, which claims priority benefit of Japanese Patent Application No. JP 2016-080397 filed in the Japan Patent Office on Apr. 13, 2016. Each of the above-referenced applications is hereby incorporated herein by reference in its entirety.

TECHNICAL FIELD

The present disclosure relates to a semiconductor storage element and an electronic device.

BACKGROUND ART

In recent years, a Large Scale Integration (LSI) on which an analog circuit, a memory, an integrated circuit, and the like are mixedly mounted on one chip is commercialized as a System on a Chip (SoC).

As the memory mounted on the LSI, for example, a Static Random Access Memory (RAM) is mainly used, but in recent years, it is considered to use a semiconductor storage element, such as a Dynamic RAM (DRAM), a Magnetic RAM (MRAM), or a Ferroelectric RAM (FeRAM), for reducing cost and power consumption.

Here, the FeRAM is a semiconductor storage element that stores information in a direction of residual polarization of the ferroelectric that can control a direction of polarization depending on an external electric field. As a structure of the FeRAM, for example, a one-Transistor-one-Capacitor (1T1C)-type structure that uses a capacitor including a ferroelectric material, as a storage element, a one-Transistor (1T)-type structure that uses, as a storage element, a field effect transistor that uses a ferroelectric material in a gate insulator film, and the like are proposed.

Nevertheless, because a plurality of storage elements share word lines and bit lines in the FeRAM of the 1T-type structure, in the case of writing information thereinto, voltage is applied not only to a selected storage element, but also to an unselected storage element that shares the word lines and the bit lines. Thus, there has been a possibility that, by writing information into the selected storage element, information stored in the unselected storage element is rewritten.

For example, Patent Literature 1 described below discloses individually controlling voltage to be applied to word lines and bit lines of a selected storage element, and voltage to be applied to word lines and bit lines of an unselected storage element, when writing information into the selected storage element.

Specifically, Patent Literature 1 discloses applying voltage of Vcc to the word lines and the bit lines of the selected storage element, and applying voltage of ⅔ Vcc or ⅓ Vcc to the word lines and the bit lines of the unselected storage, when writing information. According to the technology disclosed in Patent Literature 1, while applying voltage equal to or larger than a threshold value that can reverse a polarization direction, only to a gate insulator film of the selected storage element, voltage to be applied to a gate insulator film of the unselected storage element can be suppressed to voltage less than the threshold value.

CITATION LIST

Patent Literature

Patent Literature 1: WO 1999/026252

DISCLOSURE OF INVENTION

Technical Problem

Nevertheless, in the writing method disclosed in Patent Literature 1, voltage is applied to a gate insulator film of an unselected semiconductor storage element even though the voltage is less than the threshold value that can reverse the polarization direction. Thus, for the technology disclosed in Patent Literature 1, it has been difficult to sufficiently suppress rewriting (also referred to as "Write Disturb") of information stored in the unselected storage element that is caused when information is written into the selected storage element. In addition, even in a case where information is not rewritten, there has been a possibility that, by voltage being repeatedly applied, a gate insulator film formed by ferroelectric material deteriorates, and reliability of stored information declines.

In view of the foregoing, the present disclosure proposes a novel and improved semiconductor storage element that can enhance reliability of stored information, and an electronic device including the semiconductor storage element.

Solution to Problem

According to the present disclosure, there is provided a semiconductor storage element including: a first transistor including a gate insulator film at least partially formed by ferroelectric material; a second transistor connecting with a gate of the first transistor at one of a source or a drain; and a third transistor connecting with a drain of the first transistor at one of a source or a drain. The semiconductor storage elements are arranged in a matrix, and each of the second and third transistors connects with a word line at a gate, and connects with a bit line at another one of the source or the drain.

In addition, according to the present disclosure, there is provided a semiconductor storage element including: a first transistor and a fourth transistor including gate insulator films at least partially formed by ferroelectric material; a second transistor connecting with a gate of the first transistor at one of a source or a drain, and connecting with a drain of the fourth transistor at another one of the source or the drain; and a third transistor connecting with a gate of the fourth transistor at one of a source or a drain, and connecting with a drain of the first transistor at another one of the source or the drain. The semiconductor storage elements are arranged in a matrix, and each of the second and third transistors connects with a word line at a gate, and connects with a bit line at another one of the source or the drain.

In addition, according to the present disclosure, there is provided an electronic device including: semiconductor storage elements each including a first transistor including a gate insulator film at least partially formed by ferroelectric material, a second transistor connecting with a gate of the first transistor at one of a source or a drain, and a third transistor connecting with a drain of the first transistor at one of a source or a drain, the semiconductor storage elements being arranged in a matrix. Each of the second and third transistors of the semiconductor storage element connects with a word line at a gate, and connects with a bit line at another one of the source or the drain.

According to the present disclosure, by respectively connecting field effect transistors functioning as switching elements, to a gate and a drain of a field effect transistor that stores information, an external electric field can be selectively applied to the field effect transistor that stores information. This can prevent voltage from being applied to an unselected semiconductor storage element, and prevent stored information from being rewritten, when information is written into a selected semiconductor storage element.

Advantageous Effects of Invention

As described above, according to the present disclosure, a semiconductor storage element with enhanced reliability of stored information, and an electronic device including the semiconductor storage element can be provided.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 11 is a cross-sectional diagram describing one process of the semiconductor storage element according to the embodiment.

MODE(S) FOR CARRYING OUT THE INVENTION

Figure 1:
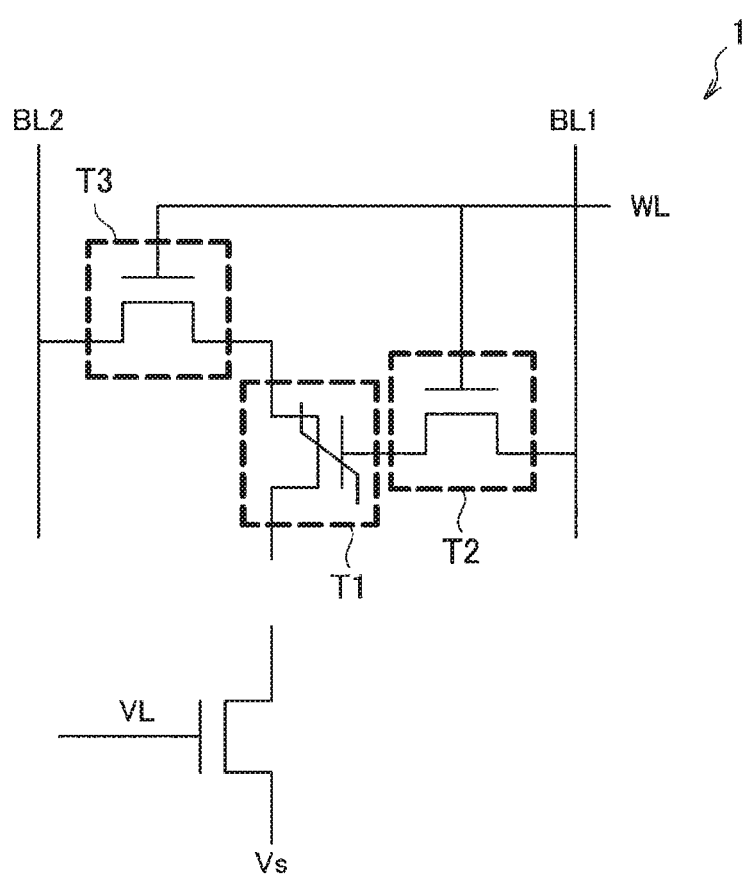
FIG. 1 is a circuit diagram illustrating an equivalent circuit of a semiconductor storage element according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, the description will be given in the following order.

1. First Embodiment
 1.1. Overview of Semiconductor Storage Element
 1.2. Operation of Semiconductor Storage Element
 1.3. Structure of Semiconductor Storage Element
 1.4. Manufacturing Method of Semiconductor Storage Element
2. Second Embodiment
 2.1. Overview of Semiconductor Storage Element
 2.2. Operation of Semiconductor Storage Element
3. Third Embodiment
 3.1. Overview of Semiconductor Storage Element
 3.2. Operation of Semiconductor Storage Element
4. Conclusion 1. First Embodiment

[1.1. Overview of Semiconductor Storage Element]

First of all, an overview of a semiconductor storage element according to a first embodiment of the present disclosure will be described with reference to FIGS. 1 and 2. FIG. 1 is a circuit diagram illustrating an equivalent circuit of a semiconductor storage element 1 according to the present embodiment.

Note that, in this specification, a "gate" represents a gate electrode of a field effect transistor. In addition, a "drain" represents a drain electrode or a drain region of a field effect transistor, and a "source" represents a source electrode or a source region of a field effect transistor. Note that a "first conductivity type" represents either one of a "p-type" and an "n-type", and a "second conductivity type" represents the other one of the "p-type" and "n-type" that is different from the "first conductivity type".

As illustrated in FIG. 1, the semiconductor storage element 1 according to the present embodiment includes a first transistor T1, a second transistor T2 connecting with a gate of the first transistor T1, and a third transistor T3 connecting with a drain of the first transistor T1. Note that, a source of the first transistor T1 connects with a power source Vs via an external transistor VL of the semiconductor storage element 1.

The first transistor T1 is a field effect transistor including a gate insulator film at least partially formed by ferroelectric material, and stores information in a direction of residual polarization of the gate insulator film. In other words, the semiconductor storage element 1 according to the present embodiment is a Ferroelectric Random Access Memory (FeRAM) of the 1T-type structure that uses the first transistor T1 as a storage element.

The second transistor T2 is a field effect transistor connecting with the gate of the first transistor at one of a source or a drain, and connecting with a first bit line BL1 at the other one of the source or the drain. In addition, a gate of the second transistor T2 connects with a word line WL, and on/off of a channel is controlled by applied voltage from the word line WL.

The third transistor T3 is a field effect transistor connecting with the drain of the first transistor at one of a source or a drain, and connecting with a second bit line BL2 at the other one of the source or the drain. In addition, a gate of the third transistor T3 connects with a word line WL, and on/off of a channel is controlled by applied voltage from the word line WL.

Accordingly, in the case of writing information, in the semiconductor storage element 1, first of all, voltage is applied from the word line WL to turn on channels of the second and third transistors T2 and T3. Next, by applying predetermined voltage to the first and second bit lines BL1 and BL2, an electric field is applied to the gate insulator film of the first transistor T1. With this configuration, by controlling a direction of residual polarization of the gate insulator film of the first transistor T1 by an external electric field, information can be written into the semiconductor storage element 1.

At this time, in another semiconductor storage element 1 connecting to the selected word line WL, because voltage is not applied to the first and second bit lines BL1 and BL2, an electric field is not applied to the gate insulator film of the first transistor T1. In addition, in another semiconductor storage element 1 connecting to the selected first and second bit lines BL1 and BL2, because channels of the second and third transistors T2 and T3 are turned off although voltage is applied to the first and second bit lines BL1 and BL2, an electric field is not applied to the gate insulator film of the first transistor T1.

On the other hand, in the case of reading out information, in the semiconductor storage element 1, first of all, voltage is applied to the word line WL to turn on the channels of the second and third transistors T2 and T3, and voltage is applied to the first bit line BL1 to thereby turn on a channel of the first transistor T1. Next, by applying voltage to the second bit line BL2 after a channel of the transistor VL is turned on, current is flowed from the drain to the source of the first transistor T1. In the first transistor T1, because a threshold voltage Vt varies depending on the direction of residual polarization of the gate insulator film, by measuring current flowing in the first transistor T1, information can be read out from the semiconductor storage element 1.

At this time, in another semiconductor storage element 1 connecting to the selected word line WL, because voltage is not applied to the first and second bit lines BL1 and BL2, an electric field is not applied to the first transistor T1. In addition, in another semiconductor storage element 1 connecting to the selected first and second bit lines BL1 and BL2, because channels of the second and third transistors T2 and T3 are turned off although voltage is applied to the first and second bit lines BL1 and BL2, an electric field is not applied to the first transistor T1.

Accordingly, in the semiconductor storage element 1, in both cases of the case of writing information into a selected semiconductor storage element, and the case of reading out information therefrom, an external electric field is not applied to a gate insulator film of an unselected semiconductor storage element. Accordingly, in the semiconductor storage element 1, stored information can be prevented from being rewritten by an external electric field being applied to the unselected semiconductor storage element. In addition, in the semiconductor storage element 1, because an electric field is applied to a gate insulator film only in the case of writing information and in the case of reading out information, the deterioration of a ferroelectric film forming a gate insulator film can be suppressed.

Subsequently, a schematic structure of the semiconductor storage element 1 having the equivalent circuit illustrated in FIG. 1 will be described with reference to FIG. 2. FIG. 2 is an explanatory diagram schematically illustrating a planar structure of the semiconductor storage element 1 according to the present embodiment.

Figure 2:
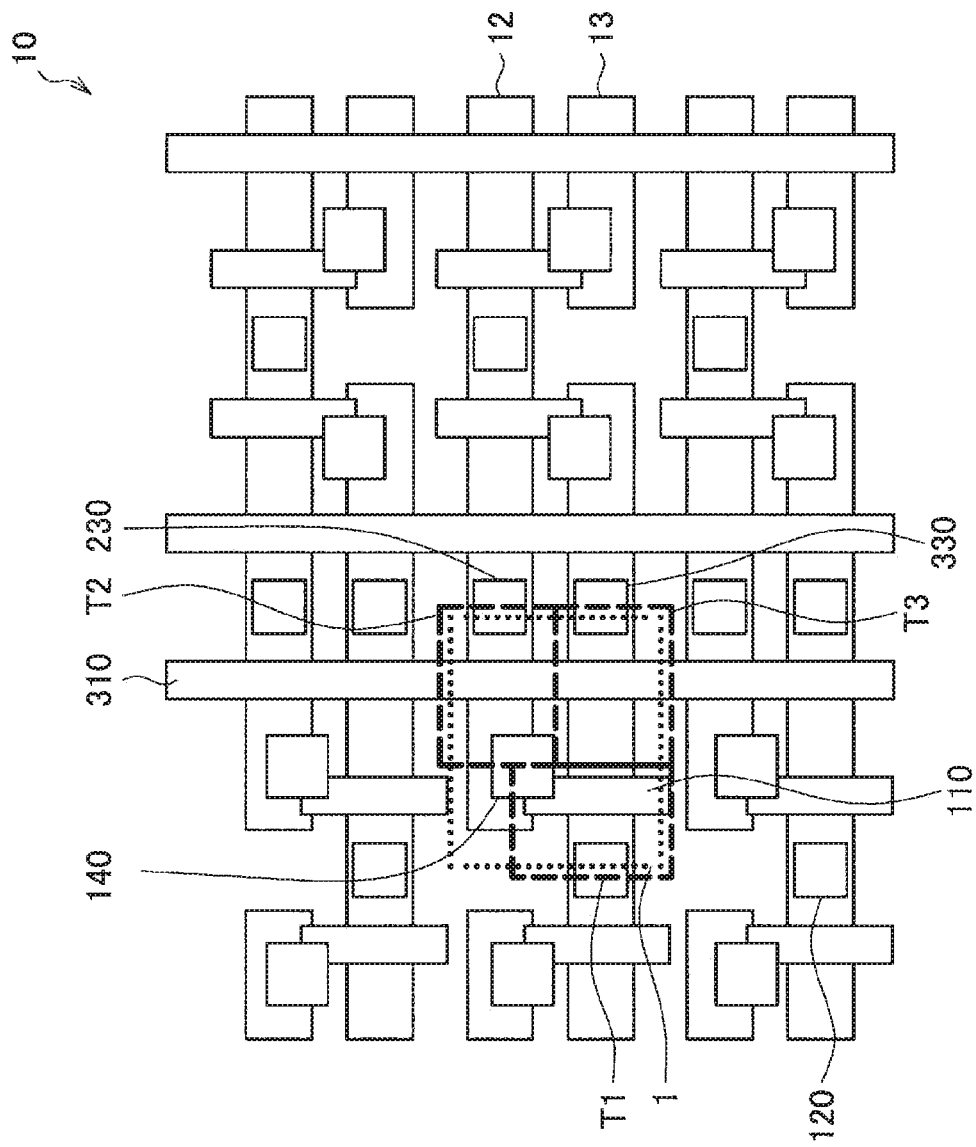
FIG. 2 is an explanatory diagram schematically illustrating a planar structure of the semiconductor storage element according to the embodiment.

As illustrated in FIG. 2, the semiconductor storage element 1 includes a number of field effect transistors arranged in an array. Specifically, the semiconductor storage element 1 is provided in a region compartmented by a dotted line in FIG. 2, and the first to third transistors T1 to T3 are provided in respective regions compartmented by broken lines.

The first transistor T1 is formed by providing a gate electrode 110 on an activation region 13 doped to have the second conductivity type. In addition, activation regions 13 sandwiching the gate electrode 110 are doped to have the first conductivity type, and form a drain region and a source region of the first transistor T1.

The source region of the first transistor T1 connects with the external transistor VL (not illustrated) and the power source Vs (not illustrated) via a contact plug 120. The drain region of the first transistor T1 connects with one of a source or drain region of the third transistor T3 in the activation region 13 provided in an extended manner. Furthermore, the gate electrode of the first transistor T1 is extended to an activation region 12 over an insulating element separation region, and connects with one of a source or drain region of the second transistor T2 at a shared contact 140.

Note that, the gate electrode 110 of the first transistor T1 is separately provided for each semiconductor storage element, and is not connected with a gate electrode of another semiconductor storage element. With this configuration, the first transistor T1 can apply voltage to the gate electrode 110 for each semiconductor storage element, and can suppress influence on another semiconductor storage element that is exerted when information stored in a gate insulator film is rewritten or read out.

The second transistor T2 is formed by providing a gate electrode 310 on an activation region 12 doped to have the second conductivity type. In addition, activation regions 12 sandwiching the gate electrode 310 are doped to have the first conductivity type, and form a drain region and a source region of the second transistor T2.

As described above, one of the source or drain region of the second transistor T2 connects with the gate electrode 110 of the first transistor T1 at the shared contact 140. On the other hand, the other one of the source or drain region of the second transistor T2 connects with the first bit line BL1 via a contact plug 230. In addition, a gate electrode 310 of the second transistor T2 is extended to the activation region 13 over an insulating element separation region, and also serves as a gate electrode of the third transistor T3. The gate electrode 310 is further extended to another semiconductor storage element over an element separation region, and functions as the word line WL.

The third transistor T3 is formed by providing a gate electrode 310 on an activation region 13 doped to have the second conductivity type. In addition, activation regions 13 sandwiching the gate electrode 310 are doped to have the first conductivity type, and form a drain region and a source region of the third transistor T3.

As described above, one of the source or drain region of the third transistor T3 connects with a source region of a first transistor T3 at the activation region 13 provided in an extended manner. On the other hand, the other one of the source or drain region of the third transistor T3 connects with the second bit line BL2 via a contact plug 330.

By being arranged in a matrix on a semiconductor substrate, for example, a number of semiconductor storage elements 1 each including the first to third transistors T1 to T3 as described above functions as a storage device 10 that stores various types of organized information.

[1.2. Operation of Semiconductor Storage Element]

Subsequently, a writing or readout operation of the semiconductor storage element 1 described in FIGS. 1 and 2 will be described. Table 1 provided below is a table that shows an example of voltage to be applied to each line in the writing or readout operation of the semiconductor storage element 1.

TABLE 1

|  | Word line WL | First bit line BL1 | Second bit line BL2 | Gate of transistor VL |
|---|---|---|---|---|
| "1" writing | 3.5 V | 3.0 V | 0 V | 0 V |
| "0" writing | 3.5 V | 0 V | 3.0 V | 0 V |
| Readout | 1.5 V | 1.0 V | 1.0 V | 1.0 V |

As shown in Table 1, in the case of writing information of "1" into the semiconductor storage element 1, for example, 3.5 V is applied to the word line WL connecting to the selected semiconductor storage element 1, 3.0 V is applied to the first bit line BL1, and 0 V is applied to the second bit line BL2. In addition, by applying 0 V to a gate of the external transistor VL connecting to the power source Vs, a channel of the external transistor VL is turned off.

At this time, an electric potential of the first bit line BL1 is transmitted to the gate of the first transistor T1 via the second transistor T2 having the turned-on channel. In addition, an electric potential of the second bit line BL2 is transmitted to the drain of the first transistor T1 via the third transistor T3 having the turned-on channel. With this configuration, because an external electric field having a high electric potential gate side is applied to the gate insulator film of the first transistor T1, a polarized state of the gate insulator film is controlled, and the information of "1" is written into the semiconductor storage element 1, for example.

On the other hand, as shown in Table 1, in the case of writing information of "0" into the semiconductor storage element 1, 3.5 V is applied to the word line WL connecting to the selected semiconductor storage element 1, 0 V is applied to the first bit line BL1, and 3.0 V is applied to the second bit line BL2. In addition, by applying 0 V to a gate of the external transistor VL connecting to the power source Vs, a channel of the external transistor VL is turned off.

At this time, an electric potential of the first bit line BL1 is transmitted to the gate of the first transistor T1 via the second transistor T2, and an electric potential of the second bit line BL2 is transmitted to the drain of the first transistor T1 via the third transistor T3. With this configuration, because an external electric field having high electric potential source and drain sides is applied to the gate insulator film of the first transistor T1, a polarized state of the gate insulator film is controlled, and the information of "0" is written into the semiconductor storage element 1, for example.

In addition, in the case of reading out information from the semiconductor storage element 1, as shown in Table 1, 1.5 V is applied to the word line WL connecting to the selected semiconductor storage element 1, 1.0 V is applied to the first bit line BL1, and 1.0 V is applied to the second bit line BL2. In addition, by applying 1.0 V to the gate of the external transistor VL connecting to the power source Vs, the channel of the external transistor VL is turned on.

At this time, in the first transistor T1, because an electric potential of the first bit line BL1 is transmitted to the gate via the second transistor T2, the channel of the first transistor T1 is turned on. In the first transistor T1, the threshold voltage Vt varies depending on the direction of residual polarization of the gate insulator film, and for example, in a case where the information of "1" is stored in the above operation, Vt become low, and in a case where information of "0" is stored in the above operation, Vt becomes high. With this configuration, because an amount of current flowing from the second bit line BL2 to the power source Vs (e.g. grand GND, 0V) varies depending on the direction of residual polarization of the gate insulator film of the first transistor T1, it can be thereby determined whether information stored in the first transistor T1 is "F" or "0".

In the semiconductor storage element 1 according to the present embodiment, the second and third transistors T2 and T3 functioning as switching elements are connected to the gate and the drain of the first transistor T1 that stores information. Accordingly, the semiconductor storage element 1 can selectively apply an external electric field to the gate insulator film of the first transistor T1. With this configuration, in the semiconductor storage element 1 according to the present embodiment, information stored in an unselected semiconductor storage element can be prevented from being deranged (also referred to as disturb) when information is written into or read out from the selected semiconductor storage element 1.

In addition, when information is read out, in a case where leak current of the first transistor T1 that is generated along the second bit line BL2 is larger than current flowing from the second bit line BL2 to the power source Vs, determination of stored information has sometimes become difficult. In the semiconductor storage element 1 according to the present embodiment, because the word line WL can be provided independently of the first transistor T1, the leak current of the first transistor T1 can be controlled in the word line WL. With this configuration, the semiconductor storage element 1 can perform determination of stored information more surely. Furthermore, by applying a negative word line technique of applying negative voltage to an unselected word line, the semiconductor storage element 1 can also suppress the leak current in the first transistor T1 more.

[1.3. Structure of Semiconductor Storage Element]

Figure 3:
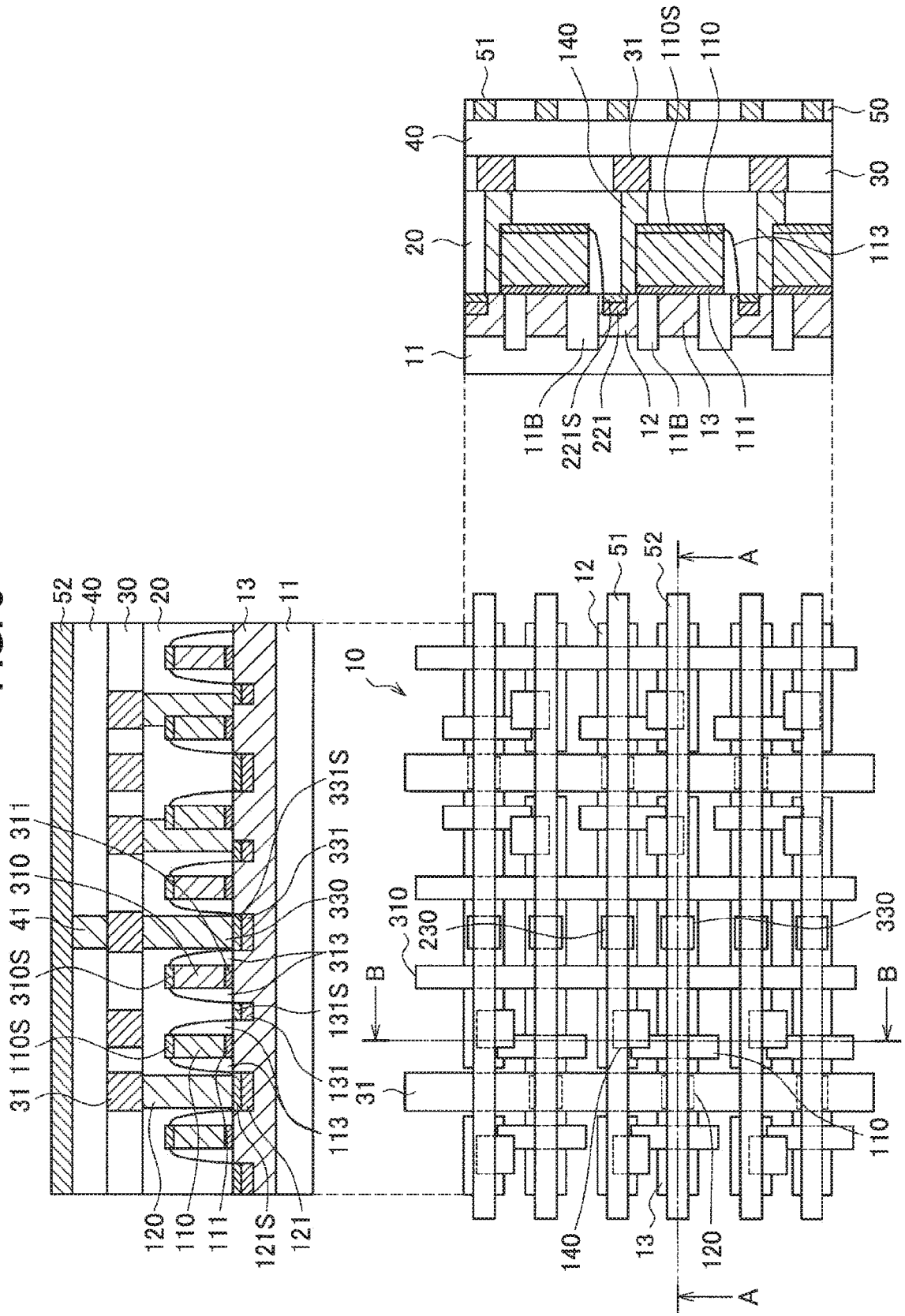
FIG. 3 is an explanatory diagram illustrating a planar structure and a cross-sectional structure of the semiconductor storage element according to the embodiment.

Subsequently, a specific structure of the semiconductor storage element 1 according to the present embodiment will be described with reference to FIG. 3. FIG. 3 is an explanatory diagram illustrating a planar structure and a cross-sectional structure of the semiconductor storage element 1 according to the present embodiment. Note that, each of cross-sectional diagrams in FIG. 3 illustrates a cross-section obtained by cutting the semiconductor storage element 1 along an AA line or a BB line.

As illustrated in FIG. 3, the activation regions 12 and 13 are provided on a semiconductor substrate 11 in a band-like manner in parallel to each other, and the gate electrodes 110 and 310 are provided on the activation regions 12 and 13, whereby the first to third transistors T1 to T3 are formed. In addition, by the gates, the sources, and the drains of the first to third transistors being connected with various wires via the contact plugs 120, 230, and 330, the semiconductor storage element 1 having the equivalent circuit illustrated in FIG. 1 is formed. Furthermore, by a number of semiconductor storage elements 1 being integrated in an array on the semiconductor substrate 11, the storage device 10 is formed.

The following description will be mainly given of the first transistor T1 and the third transistor T3 described in the cross-sectional diagrams. Note that, unless otherwise clearly indicated, the configuration of the second transistor T2 is similar to the configuration of the third transistor.

The semiconductor substrate 11 is a support substrate on which the semiconductor storage element 1 and the storage device 10 are to be formed. As the semiconductor substrate 11, a substrate including various semiconductors may be used, and for example, a substrate including polycrystalline, monocrystalline, or amorphous silicon (Si) may be used. In addition, the semiconductor substrate 11 may be a Silicon On Insulator (SOI) substrate in which an insulating film such as $SiO_2$ is sandwiched in a silicon substrate.

The activation regions 12 and 13 are regions of the second conductivity type, and are provided in a band-like manner with being separated from each other by an element separation region 11B. For example, the activation regions 12 and 13 may be formed by introducing an impure substance of the second conductivity type (e.g. p-type impure substance such as boron (B)) to the semiconductor substrate 11. Note that, the activation region 12 functions as channel regions of the first and third transistors T1 and T3, and the activation region 13 functions a channel region of the second transistor T2.

The element separation region 11B is an insulating region, and electrically separates field effect transistors provided on the activation regions 12 and 13, from each other, by electrically separating the activation regions 12 and 13 from each other. Specifically, the element separation region 11B may be formed by an insulating oxynitride such as silicon oxide ($SiO_x$) or silicon nitride ($SiN_x$). For example, the element separation region 11B may be formed by removing a part of the semiconductor substrate 11 in a desired region, by etching or the like, using a Shallow Trench Isolation (STI) method, and then, filling an opening formed by the etching, with silicon oxide ($SiO_x$). In addition, the element separation region 11B may be formed by thermally oxidizing the semiconductor substrate 11 in a predetermined region, and performing conversion into an oxide, using a Local Oxidation of Silicon (LOCOS) method.

A first gate insulator film 111 is a gate insulator film of the first transistor T1. Because the first transistor T1 functions as a storage element that stores information, the first gate insulator film 111 is at least partially formed by ferroelectric material which autonomously polarizes, and of which a direction of polarization can be controlled in an external electric field. For example, the first gate insulator film 111 may be formed by ferroelectric material having a perovskite structure such as lead zirconium titanate (Pb (Zr, Ti) $O_3$: PZT), or strontium bismuth tantalite ($SrBi_2Ta_2O_9$: SBT). In addition, the first gate insulator film 111 may be a ferroelectric film obtained by transubstantiating, by thermal treatment or the like, a film formed by high-dielectric material such as $HfO_x$, $ZrO_x$, or $HfZrO_x$, or may be a ferroelectric film formed by doping a film formed by the above-described high-dielectric materials, with an atom such as lanthanum (La), silicon (Si), or gadolinium (Gd). In addition, the first gate insulator film 111 may be formed by a plurality of layers. For example, the first gate insulator film 111 may include a film stack including a film including ferroelectric material, and an insulating film such as silicon oxide ($SiO_x$) or silicon nitride ($SiN_x$).

The gate electrode 110 is a gate electrode of the first transistor T1, and is separately provided on the first gate insulator film 111 for each of the semiconductor storage elements 1. In addition, the gate electrode 110 is extended to the activation region 12 over the element separation region 11B, and connects with either one (i.e. the activation region 12) of the source or the drain of the second transistor T2 via the shared contact 140. The gate electrode 110 is separately provided for each of the semiconductor storage elements 1, and can prevent voltage applied to the gate electrode of a selected semiconductor storage element 1, from influencing another semiconductor storage element 1.

For example, the gate electrode 110 may be formed by polysilicon or the like, or may be formed by metal having a smaller resistance value than that of polysilicon. In addition, the gate electrode 110 may be formed into a layer stack structure including a plurality of layers including a metal layer, and a layer including polysilicon. For example, the gate electrode 110 may be formed into a layer stack structure including a metal layer including TiN or TaN that is provided on the first gate insulator film 111, and a layer including polysilicon. According to such a layer stack structure, the gate electrode 110 can prevent a depletion layer from being formed in the layer that includes polysilicon, by applied voltage.

A third gate insulator film 311 is a gate insulator film of the third transistor T3. Because the third transistor T3 functions as a switching element that controls voltage application to the first transistor T1, the third gate insulator film 311 is formed by insulating material that is common as a gate insulator film of a field effect transistor. For example, the third gate insulator film 311 may be formed by an insulating oxynitride such as silicon oxide ($SiO_x$) or silicon nitride ($SiN_x$), or may be formed by hafnium oxide or the like that has higher electric permittivity than silicon oxide or the like.

Nevertheless, it should be appreciated that the third gate insulator film 311 may be formed by ferroelectric material similarly to the first gate insulator film 111. In such a case, because the third gate insulator film 311 and the first gate insulator film 111 can be simultaneously formed, manufacturing processes of the semiconductor storage element 1 can be simplified.

The gate electrode 310 is a gate electrode of the third transistor T3, and extended on the third gate insulator film 311 over the plurality of semiconductor storage elements 1. In addition, the gate electrode 310 is extended to the activation region 12 over the element separation region 11B, and also functions as a gate electrode of the second transistor T2. Note that, the gate electrode 310 may be formed by material similar to the material of the gate electrode 110. Because the gate electrode 310 functions as the word line WL by being extended over the plurality of semiconductor storage elements 1, a process of separately providing a word line can be omitted, and a planar area of the semiconductor storage elements 1 can be made smaller.

A first source region 121 is a region of the first conductivity type, and functions as the source region of the first transistor T1. The first source region 121 is provided in the activation region 13 on a side facing a side on which the gate electrode 310 is provided, across the gate electrode 110, and connects with the external transistor VL (not illustrated) and the power source Vs (not illustrated) via the contact plug 120. For example, the first source region 121 may be formed by introducing an impure substance of the first conductivity type (e.g. n-type impure substance such as phosphorus (P) and arsenic (As)) to a predetermined region of the activation region 13.

A first drain region 131 is a region of the first conductivity type, and functions as the drain region of the first transistor T1, and either one of the source or drain region of the third transistor T3. The first drain region 131 is provided in the activation region 13 between the gate electrode 110 and the gate electrode 310, and connects the drain of the first transistor T1 and either one of the source or the drain of the third transistor T3. For example, the first drain region 131 may be formed by introducing an impure substance of the first conductivity type (e.g. n-type impure substance such as phosphorus (P) and arsenic (As)) to a predetermined region of the activation region 13.

A third source/drain region 331 is a region of the first conductivity type, and functions as the source or drain region of the third transistor T3. The third source/drain region 331 is provided in the activation region 13 on a side facing a side on which the gate electrode 110 is provided, across the gate electrode 310, and connects with the second bit line BL2 (not illustrated) via the contact plug 330. For example, the first source region 121 may be formed by introducing an impure substance of the first conductivity type (e.g. n-type impure substance such as phosphorus (P) and arsenic (As)) to a predetermined region of the activation region 13.

A second source/drain region 221 is a region of the first conductivity type, and functions as the source or drain region of the second transistor T2. The second source/drain region 221 is provided in the activation region 12 on the same side as the side on which the gate electrode 110 is provided, with respect to the gate electrode 310, and connects with the gate electrode 110 via the shared contact 140. For example, the first source region 121 may be formed by introducing an impure substance of the first conductivity type (e.g. n-type impure substance such as phosphorus (P) and arsenic (As)) to a predetermined region of the activation region 13.

Here, a channel region of the first transistor T1 (i.e. the activation region 13 below the first gate insulator film 111) has been described as a region of the second conductivity type in the above description, but the channel region may be a region of the first conductivity type that has lower concentration than the first source region 121 and the first drain region 131. In such a case, it becomes possible to individually control a threshold voltage of the first transistor T1 with respect to the second and third transistors T2 and T3.

By being respectively provided on the surfaces of the gate electrode 110, the first source region 121, the first drain region 131, the third source/drain region 331, and the second source/drain region 221, contact regions 110S, 121S, 131S, 331S, and 221S reduce their respective contact resistances. Specifically, the contact regions 110S, 121S, 131S, 331S, and 221S may be formed by an alloy of a semiconductor or metal that forms the semiconductor substrate 11 or the gate electrode 110 or 310, and high melting point metal such as Ni. For example, the contact regions 110S, 121S, 131S, 331S, and 221S may be formed by a high melting point metal silicide such as NiSi.

The side wall insulating films 113 and 313 are side walls with insulating films that are provided on the side surfaces of the gate electrodes 110 and 310. Specifically, the side wall insulating films 113 and 313 may be formed by forming insulating films in a region including the gate electrodes 110 and 310, and then performing etching having perpendicular anisotropy. For example, each of the side wall insulating films 113 and 313 may be formed by a single layer or a plurality of layers that includes an insulating oxynitride such as silicon oxide ($SiO_x$) or silicon nitride ($SiN_x$).

The side wall insulating films 113 and 313 block an entering impure substance when an impure substance is introduced to the semiconductor substrate 11. Accordingly, the side wall insulating films 113 and 313 can control in a self-aligning manner a positional relationship between the first source region 121, the first drain region 131, and the third source/drain region 331 to which impure substances have been introduced, and the gate electrodes 110 and 310. In addition, by using the side wall insulating films 113 and 313, it is possible to form, between source and drain regions and a gate electrode of each transistor, a Lightly-Doped Drain (LDD) region having the same conductivity type as the source and drain region, and having lower concentration.

A planarization film 20 is an insulating layer provided on the gate electrodes 110 and 310 over the entire surface of the semiconductor substrate 11. The planarization film 20 buries the first to third transistors T1 to T3, and electrically insulates various wires to be provided on the planarization film 20, and the first to third transistors T1 to T3. For example, the planarization film 20 may be formed by an insulating oxynitride such as silicon oxide ($SiO_x$) or silicon nitride ($SiN_x$).

Note that, a liner layer including insulating material may be provided between the gate electrodes 110 and 310, and the planarization film 20 over the entire surface of the semiconductor substrate 11, although the liner layer is not illustrated in FIG. 3. The liner layer prevents etching from excessively progressing, by providing a high etching selection ratio between the planarization film 20, when the contact plugs 120 and 330, and the shared contact 140 are formed. The liner layer may be formed by an insulating oxynitride such as silicon oxide ($SiO_x$) or silicon nitride ($SiN_x$), for example.

In addition, the liner layer may be formed as a layer that adds compressional stress or tensile stress to the first gate insulator film 111 and the third gate insulator film 311. In such a case, the liner layer can enhance a polarization property of the first gate insulator film 111, by a piezoelectric effect, or enhance carrier mobility of the third gate insulator film 311.

The contact plugs 120, 330, and 230 are provided with penetrating through the planarization film 20. By connecting with the first source region 121, the contact plug 120 electrically connects the source of the first transistor T1, and the external transistor VL (not illustrated) and the power source Vs (not illustrated). In addition, by connecting with the third source/drain region 331, the contact plug 330 electrically connects the other one of the source or the drain of the third transistor T3, and the second bit line BL2 (not illustrated). Furthermore, the contact plug 230 electrically connects the other one of the source or the drain of the second transistor T2, and the first bit line BL1 (not illustrated).

With penetrating through the planarization film 20, the shared contact 140 is provided on the gate electrode 110 and the second source/drain region 221 so as to lie astride the gate electrode 110 and the second source/drain region 221, and electrically connects the gate electrode 110 and the second source/drain region 221. According to this, the gate electrode 110 and the second source/drain region 221 can be electrically connected without separately providing a wire. A planar area of the semiconductor storage elements 1 can be therefore made smaller.

Note that, the above contact plugs 120, 330, and 230, and the shared contact 140 may be formed by low-resistance metal such as titanium (Ti) or tungsten (W), or a metal compound such as titanium nitride (TiN). In addition, the contact plugs 120, 330, and 230, and the shared contact 140 may be formed into a layer stack structure including a plurality of layers. Specifically, the contact plugs 120, 330, and 230, and the shared contact 140 may be formed into a layer stack structure including Ti or TiN, and W.

A wiring layer 31 is provided on the planarization film 20 with extending in a direction perpendicular to a direction in which the activation regions 12 and 13 extend. The wiring layer 31 electrically connects the contact plug 120, and the external transistor VL (not illustrated) and the power source Vs (not illustrated). In other words, the wiring layer 31 connects the source of the first transistor T1 of each of the semiconductor storage elements 1, and the external transistor VL and the power source Vs. The wiring layer 31 may be formed by metal material such as copper (Cu) and aluminum (Al), for example.

An interlayer insulating film 30 buries various wires such as the wiring layer 31, and is provided on the planarization film 20 over the entire surface of the semiconductor substrate 11. The interlayer insulating film 30 may be formed by an insulating oxynitride such as silicon oxide ($SiO_x$) or silicon nitride ($SiN_x$), for example.

A contact 41 is provided with penetrating through an interlayer insulating film 40, and electrically connects the wires provided inside the interlayer insulating film 30, and wires provided inside an interlayer insulating film 50. Similarly to the contact plugs 120 and 330, the contact 41 may be formed by low-resistance metal such as titanium (Ti) or tungsten (W), or a metal compound such as titanium nitride (TiN). In addition, the contact 41 may be formed into a layer stack structure including a plurality of layers. Specifically, the contact 41 may be formed into a layer stack structure including Ti or TiN, and W, or may be formed into a dual damascene structure of Cu simultaneously with wiring layers 51 and 52 to be described later.

The interlayer insulating film 40 is provided on the interlayer insulating film 30 over the entire surface of the semiconductor substrate 11. The interlayer insulating film 40 may be formed by an insulating oxynitride such as silicon oxide ($SiO_x$) or silicon nitride ($SiN_x$), for example.

The wiring layers 51 and 52 are provided on the interlayer insulating film 40 with extending in a direction parallel to the direction in which the activation regions 12 and 13 extend. In addition, the wiring layer 51 electrically connects with the contact plug 230, and the wiring layer 52 electrically connects with the contact plug 330. In other words, the wiring layer 51 functions as the first bit line BL1 that electrically connects with the other one of the source or the drain of the second transistor T2 of each of the semiconductor storage elements 1, and the wiring layer 52 functions as the second bit line BL2 that electrically connects with the other one of the source or the drain of the third transistor T3 of each of the semiconductor storage elements 1. The wiring layers 51 and 52 may be formed by metal material such as copper (Cu) and aluminum (Al), for example.

An interlayer insulating film 50 buries various wires such as the wiring layers 51 and 52, and is provided on the interlayer insulating film 40 over the entire surface of the semiconductor substrate 11. The interlayer insulating film 50 may be formed by an insulating oxynitride such as silicon oxide ($SiO_x$) or silicon nitride ($SiN_x$), for example.

According to the above structure, the semiconductor storage elements 1 that can prevent application of voltage to an unselected storage element, and can apply voltage only to a selected storage element can be formed in a smaller planar area. With this configuration, because it is possible to enhance an integration degree of the semiconductor storage elements 1, it is possible to enhance storage density of the storage device 10 in which the semiconductor storage elements 1 are integrated.

[1.4. Manufacturing Method of Semiconductor Storage Element]

Next, a manufacturing method of the semiconductor storage element 1 according to the present embodiment will be described with reference to FIGS. 4 to 11. FIGS. 4 to 11 are cross-sectional views describing manufacturing processes of the semiconductor storage element 1 according to the present embodiment.

Figure 4:
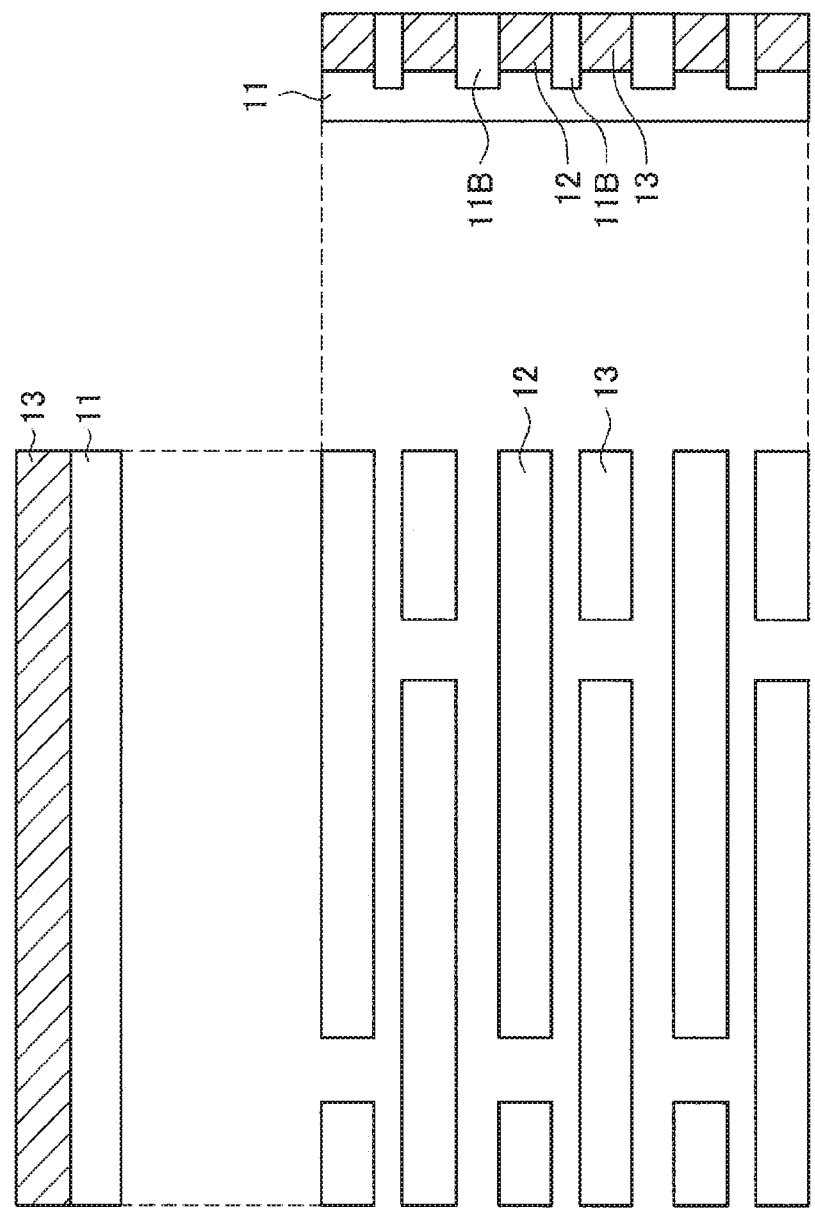
FIG. 4 is a cross-sectional diagram describing one process of the semiconductor storage element according to the embodiment.

First of all, as illustrated in FIG. 4, the activation regions 12 and 13, and the element separation region 11B are formed on the semiconductor substrate 11.

Specifically, a $SiO_2$ film is formed by dry oxidation or the like, on the semiconductor substrate 11 including Si, and furthermore, a $Si_3N_4$ film is formed by a low-pressure Chemical Vapor Deposition (CVD) method or the like. Subsequently, a resist layer patterned so as to protect a region in which the activation regions 12 and 13 are to be formed is formed on the $Si_3N_4$ film, and the $SiO_2$ film, the $Si_3N_4$ film, and the semiconductor substrate 11 are etched in a depth of 350 nm to 400 nm.

Next, by forming $SiO_2$ into a film having a film thickness of 650 nm to 700 nm, an opening formed by etching is filled, and the element separation region 11B is formed. For example, a high-density plasma CVD method can be used for the film formation of $SiO_2$. According to this method, a $SiO_2$ film that has good unevenness coatability, and is precise can be formed.

Subsequently, the surface of the semiconductor substrate 11 is planarized by removing the excessively-formed $SiO_2$ film using a Chemical Mechanical Polish (CMP) method or the like. The removal of the $SiO_2$ film using the CMP may be performed until the $Si_3N_4$ film is exposed, for example.

Furthermore, the $Si_3N_4$ film is removed using hot phosphoric acid or the like. Note that, before the removal of the $Si_3N_4$ film, the semiconductor substrate 11 may be annealed under an $N_2$, $O_2$, or $H_2/O_2$ environment, for making the $SiO_2$ film of the element separation region 11B into a more precise film, or for rounding corners of the activation regions 12 and 13.

Next, the activation regions 12 and 13 of the second conductivity type are formed by ion-implanting an impure substance of the second conductivity type (e.g. boron, etc.) after oxidizing a region of the semiconductor substrate 11 that corresponds to the activation regions 12 and 13, by about 10 nm.

Figure 5:
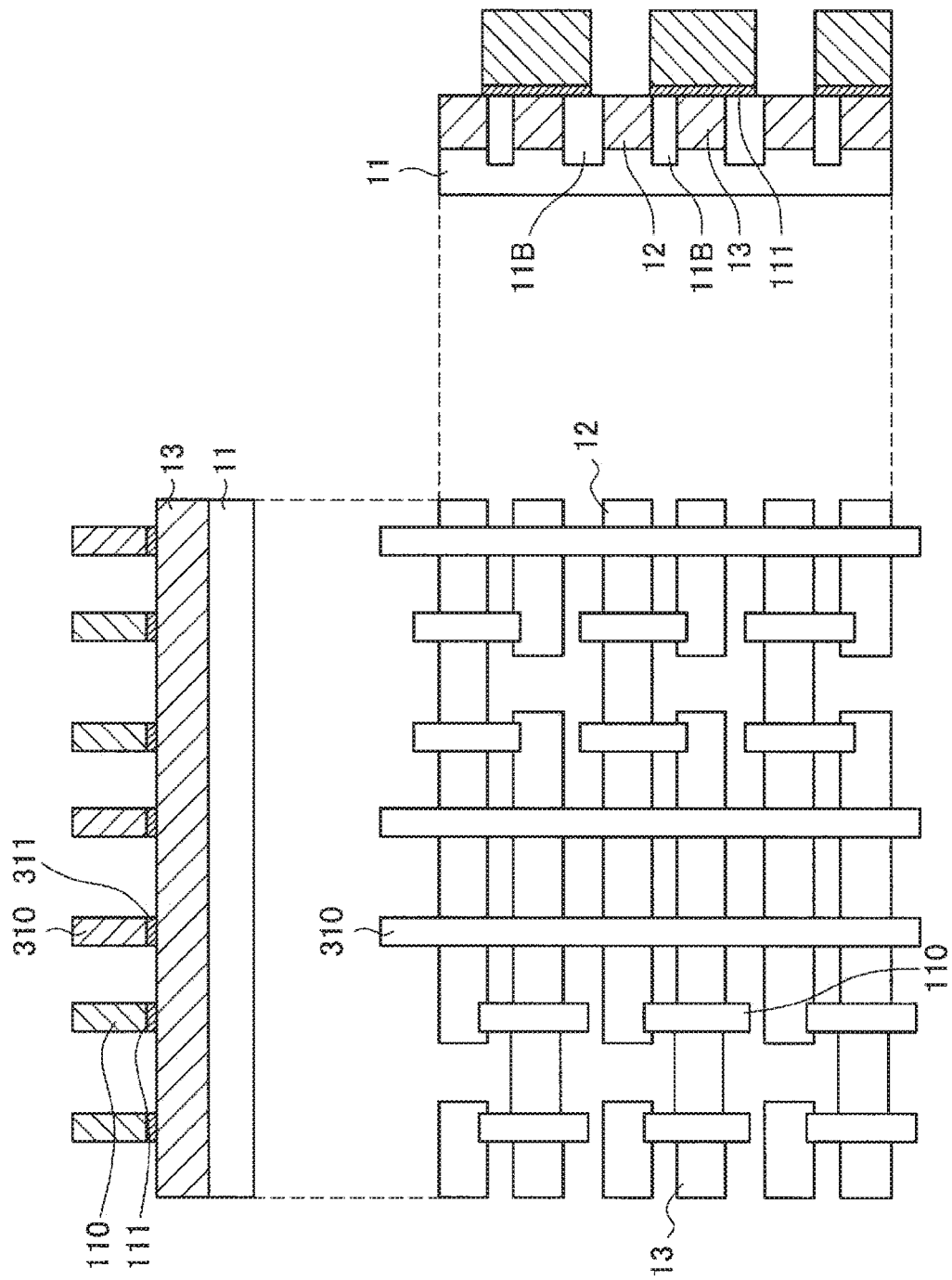
FIG. 5 is a cross-sectional diagram describing one process of the semiconductor storage element according to the embodiment.

Next, as illustrated in FIG. 5, after the first gate insulator film 111 and the third gate insulator film 311 are formed, the gate electrodes 110 and 310 are respectively formed on the first gate insulator film 111 and the third gate insulator film 311.

Specifically, first of all, the $SiO_2$ film covering the surface of the semiconductor substrate 11 is peeled off using hydrofluoric acid solution or the like. After that, a $SiO_2$ film serving as a base of the first gate insulator film 111 and the third gate insulator film 311 is formed on the semiconductor substrate 11 into a film thickness of 0.5 nm to 1.5 nm using Rapid Thermal Oxidization (RTO) treatment, oxygen plasma treatment, treatment using hydrogen peroxide containing chemical solution, or the like. Subsequently, hafnium oxide ($HfO_x$) being a high-dielectric member is formed into a film by the CVD method, an Atomic Layer Deposition (ALD) method, or the like. The first gate insulator film 111 and the third gate insulator film 311 are thereby formed.

Note that, zirconium oxide ($ZrO_x$), hafnium zirconium oxide ($HfZrO_x$), or the like can be used in place of the hafnium oxide. In addition, the first gate insulator film 111 and the third gate insulator film 311 may be formed by converting these high-dielectric members into a ferroelectric film by doping these high-dielectric members with lanthanum (La), silicon (Si), gadolinium (Gd), or the like.

Next, after TiN is formed into a film thickness of 5 nm to 20 nm using a sputtering method, the CVD method, the ALD method, or the like, polysilicon is formed into a film having a film thickness of 50 nm to 150 nm, by the low-pressure CVD method that uses $SiH_4$ gas. Furthermore, by performing anisotropic etching with HBr gas or Cl-based gas using a patterned resist as a mask, the gate electrodes 110 and 310 are formed. Note that, TaN or the like can be used in place of TiN.

In addition, a width of the gate electrodes 110 and 310 to be formed after the anisotropic etching can be made thinner by performing trimming treatment of the resist by $O_2$ plasma after patterning the resist. For example, in a 32-nm process node, a width (gate length) of the gate electrodes may be set to 20 nm to 30 nm.

Figure 6:
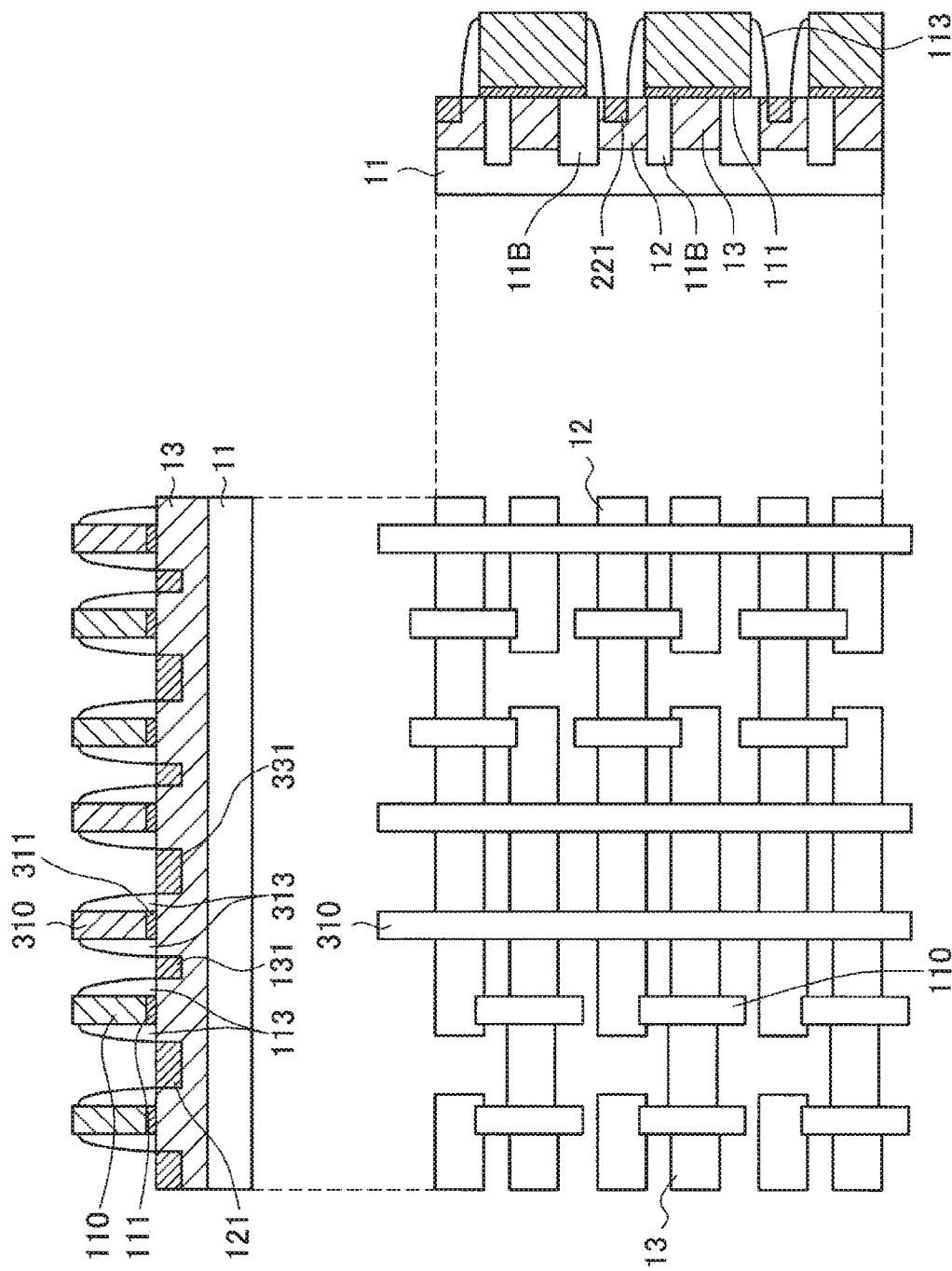
FIG. 6 is a cross-sectional diagram describing one process of the semiconductor storage element according to the embodiment.

Next, as illustrated in FIG. 6, after the side wall insulating films 113 and 313 are formed on both side surfaces of the gate electrodes 110 and 310, the first source region 121, the first drain region 131, the second source/drain region 221, and the third source/drain region 331 are formed.

Specifically, first of all, anisotropic etching is performed after $Si_3N_4$ is formed into a film having a film thickness of 5 nm to 15 nm, using the low-pressure CVD method. Subsequently, by performing anisotropic etching after $SiO_2$ is formed into a film having thickness of 10 nm to 30 nm, by a plasma CVD method, and furthermore, $Si_3N_4$ is formed into a film having thickness of 30 nm to 50 nm, by the plasma CVD method, the side wall insulating films 113 and 313 are formed on the both side surfaces of the gate electrodes 110 and 310.

After that, by ion-implanting an impure substance of the first conductivity type (phosphorus, arsenic, etc.) at concentration of 1 to $2\times10^{15}/cm^2$ at 40 keV to 50 keV, the impure substance of the first conductivity type is introduced to exposed regions of the activation regions 12 and 13. Furthermore, by performing Rapid Thermal Annealing (RTA) for five seconds at 1000° C., the ion-implanted impure substance is activated. The source and drain regions of the first to third transistors T1 to T3 are thereby formed. Note that, for suppressing diffusion of the impure substance to an unintended region, activation of the impure substance can also be performed by spike RTA.

Note that, the LDD region can also be formed by ion-implanting an impure substance of the first conductivity type (phosphorus, arsenic, etc.) at concentration of 5 to $20\times10^{14}/cm^2$ at 5 keV to 10 keV before the side wall insulating films 113 and 313 are formed, or after the side wall insulating films 113 and 313 are partially formed. Because a short channel effect can be suppressed by forming the LDD region, variations in properties of the first to third transistors T1 to T3 can be suppressed.

Figure 7:
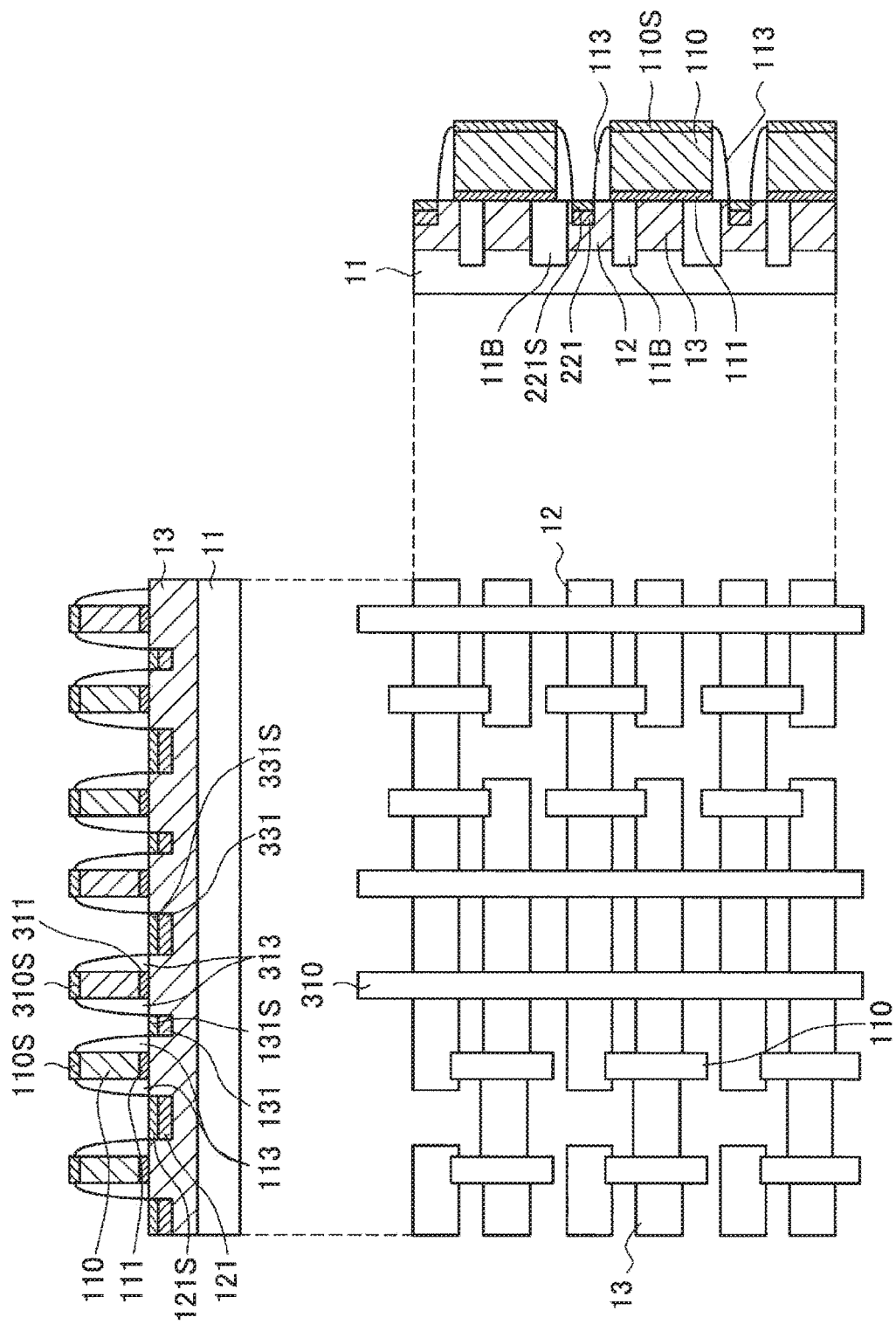
FIG. 7 is a cross-sectional diagram describing one process of the semiconductor storage element according to the embodiment.

Subsequently, as illustrated in FIG. 7, the contact regions 110S, 121S, 131S, 331S, and 221S are formed on the surfaces of the gate electrode 110, the first source region 121, the first drain region 131, the third source/drain region 331, and the second source/drain region 221.

Specifically, by forming nickel (Ni) into a film having a film thickness of 6 nm to 8 nm, using the sputtering method or the like, and then performing the RTA for ten seconds to 60 seconds at 300° C. to 450° C., nickel (Ni) on Si is reacted with Si (i.e. so-called silicidation is performed). The low-resistance contact regions 110S, 121S, 131S, 331S, and 221S are thereby formed. Note that, unreacted Ni on the element separation region 11B or the like may be removed using $H_2SO_4/H_2O_2$.

Here, the contact regions 110S, 121S, 131S, 331S, and 221S can also be formed by $CoSi_2$ or NiSi by forming cobalt (Co) or nickel platinum (NiPt) into a film, in place of Ni. The condition of RTA that is used at the time can be appropriately set in accordance with metal to be made into a silicide.

Note that, the above description has been given of an example in which the first transistor T1 that stores information, and the second and third transistors T2 and T3 that perform a switching operation are simultaneously formed, but a manufacturing method of the semiconductor storage element 1 according to the present embodiment is not limited to the example in FIG. 5. For example, the second and third transistors T2 and T3 that perform a switching operation may be formed in a different process from the first transistor T1 that stores information.

Further, simultaneously with the above processes, a field effect transistor constituting a logic circuit such as a complementary metal-oxide-semiconductor (CMOS) can also be formed in a region different from the region in which the semiconductor storage element 1 is to be formed. An LSI on which a storage device 10 including the semiconductor storage element 1, and a logic circuit such as a CMOS are mixedly mounted can be thereby manufactured through a smaller number of processes. In this case, in the field effect transistor constituting the logic circuit, a gate insulator film is formed not by a ferroelectric but by insulating material such as oxidized film.

Figure 8:
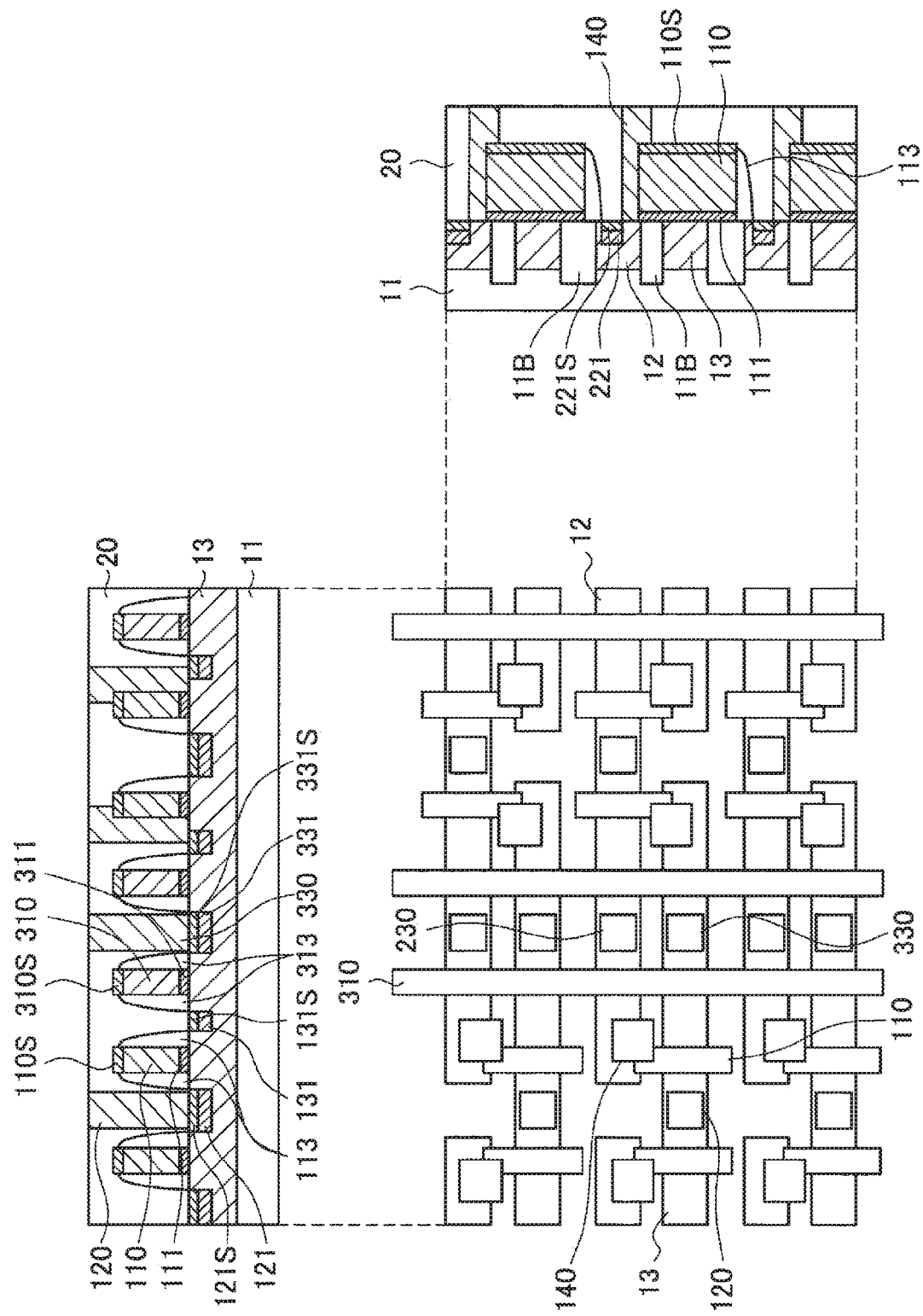
FIG. 8 is a cross-sectional diagram describing one process of the semiconductor storage element according to the embodiment.

Next, as illustrated in FIG. 8, the planarization film 20 is formed over the entire surface of the semiconductor substrate 11, and the contact plugs 120 and 330, and the shared contact 140 are formed.

Specifically, by performing planarization by the CMP method after $SiO_2$ is formed into a film having a film thickness of 500 nm to 1500 nm, using the CVD method or the like, the planarization film 20 is formed. Subsequently, by etching the planarization film 20, an opening is formed on a region provided astride the first source region 121, the third source/drain region 331, and the gate electrode 110 to the second source/drain region 221.

Next, by forming titanium (Ti) and titanium nitride (TiN) into films by the CVD method or the like, in the opening formed by the etching, and then, further forming tungsten (W) into films, and performing planarization by the CMP method, the contact plugs 120 and 330, and the shared contact 140 are formed. Note that, Ti and TiN may be formed into films by the sputtering method or the like that uses Ion Metal Plasma (IMP). In addition, planarization may be performed using whole surface etch back in place of the CMP method.

Here, before the planarization film 20 is formed, a liner layer including SiN may be formed. Specifically, the liner layer may be formed by forming SiN into a film having a film thickness of 10 nm to 50 nm, by the plasma CVD method. In addition, the liner layer can also be formed by the low-pressure CVD method or the ALD method. In a case where the liner layer is provided, by performing etching under a condition where the liner layer and the planarization film 20 have a high selection ratio, excessive etching can be prevented and etching can be formed with good controllability.

Furthermore, the liner layer may be formed as a layer that adds compressional stress or tensile stress. For example, by forming the liner layer in a condition example shown below, the liner layer can be formed as a layer that adds compressional stress or tensile stress.

For example, in the case of forming the liner layer as a layer that adds tensile stress, film formation can be performed by supplying nitrogen ($N_2$) gas (500 $cm^3$/min to 2000 $cm^3$/min), ammonia ($NH_3$) gas (500 $cm^3$/min to 1500 $cm^3$/min), and mono-silane ($SiH_4$) gas (50 $cm^3$/min to 300 $cm^3$/min) into a chamber, setting a temperature of the semiconductor substrate 11 to 200° C. to 400° C., setting film formation pressure to 0.67 kPa to 2.0 kPa, setting RF power to 50 W to 500 W, and causing chemical reaction by the plasma CVD method. Furthermore, after the film formation, by supplying helium (He) gas (10 L/min to 20 L/min), setting a temperature to 400° C. to 600° C., setting pressure to 0.67 kPa to 2.0 kPa, and performing Ultra Violet (UV) irradiation treatment using lamp power of 1 kW to 10 kW, the liner layer that adds tensile stress can be formed.

In addition, in the case of forming the liner layer as a layer that adds compressional stress, the liner layer that adds compressional stress can be formed by performing film formation by supplying hydrogen ($H_2$) gas (1000 $cm^3$/min to 5000 $cm^3$/min), nitrogen ($N_2$) gas (500 $cm^3$/min to 2500 $cm^3$/min), argon (Ar) gas (1000 $cm^3$/min to 5000 $cm^3$/min), ammonia ($NH_3$) gas (50 $cm^3$/min to 250 $cm^3$/min), and trimethylsilane (($CH_3)_3SiH$) gas (10 $cm^3$/min to 50 $cm^3$/min) into a chamber, setting a temperature of the semiconductor substrate 11 to 400° C. to 600° C., setting film formation pressure to 0.13 kPa to 0.67 kPa, setting RF power to 50 W to 500 W, and causing chemical reaction by the plasma CVD method.

Figure 9:
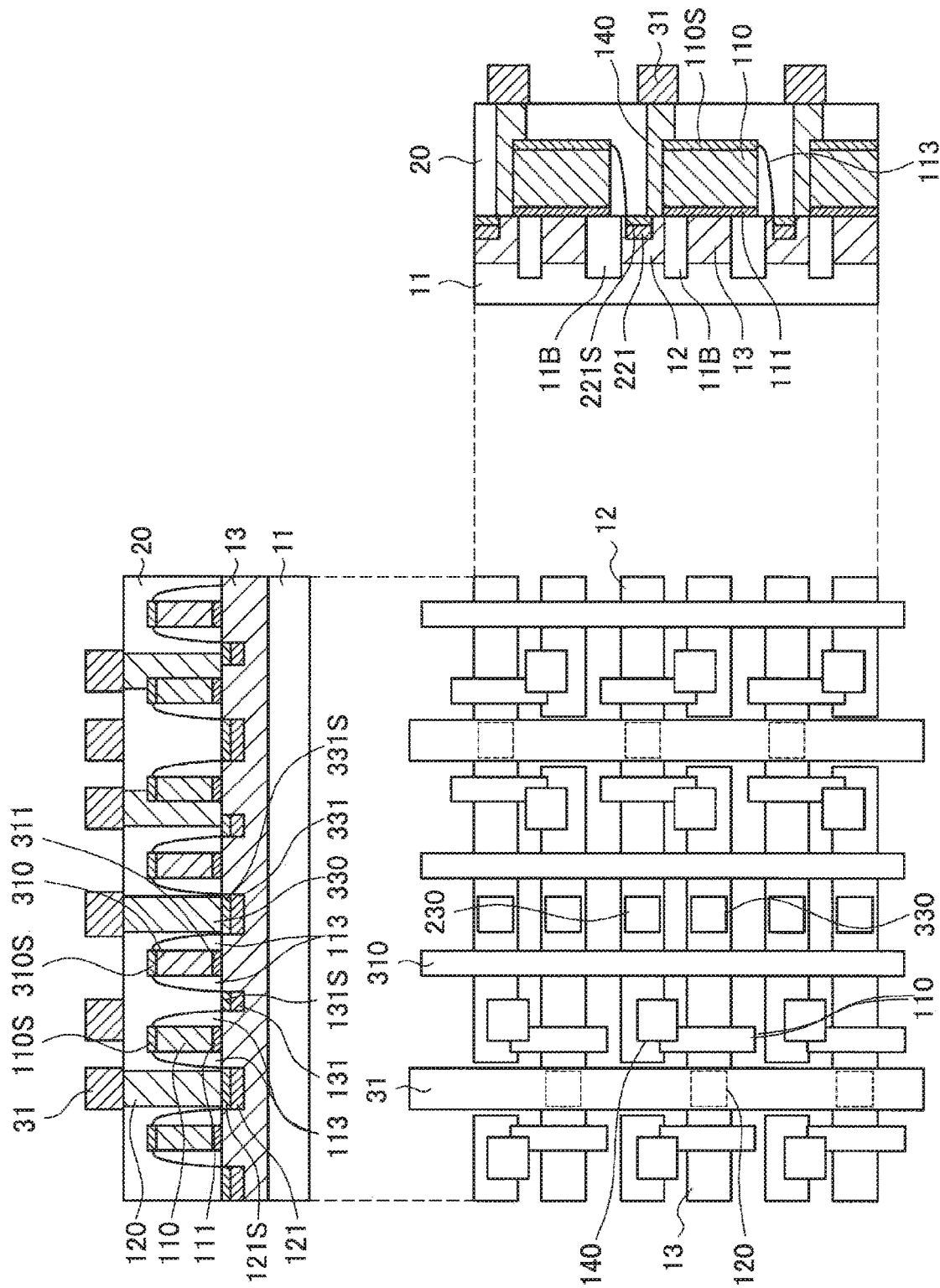
FIG. 9 is a cross-sectional diagram describing one process of the semiconductor storage element according to the embodiment.

Subsequently, as illustrated in FIG. 9, various wires including the wiring layer 31 are formed on the planarization film 20. Specifically, the various wires including the wiring layer 31 are formed by wiring material such as copper (Cu), by a damascene method. By being formed on the contact plug 120 of each of the semiconductor storage elements 1, the wiring layer 31 functions as a wire that connects the source of the first transistor T1 and the external power source Vs. In addition, a wire formed on the contact plug 330 functions as a base of the first bit line BL1 and the second bit line BL2 that are to be formed in a subsequent stage. Note that, the various wires including the wiring layer 31 may be formed by aluminum (Al) or the like.

Figure 10:
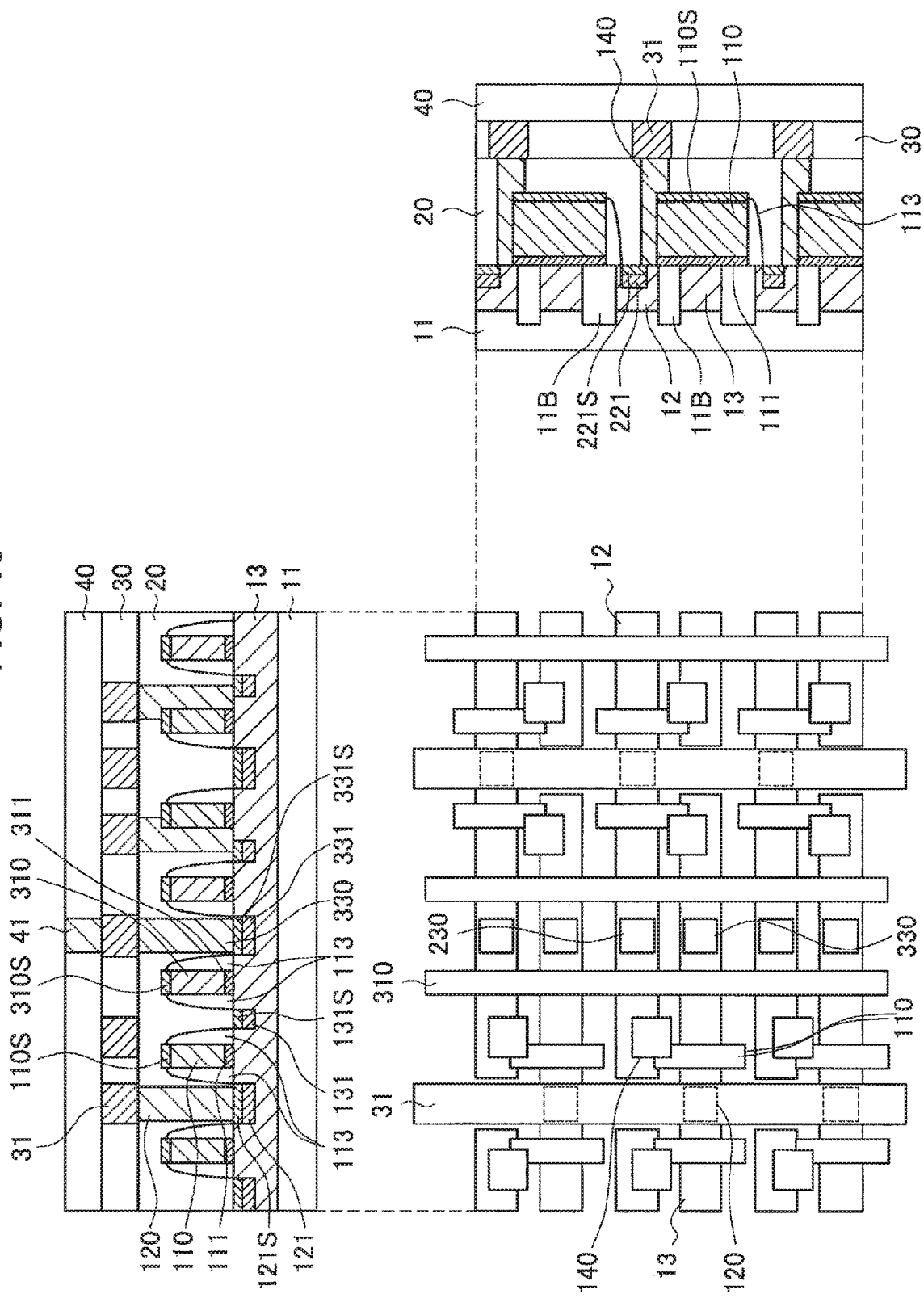
FIG. 10 is a cross-sectional diagram describing one process of the semiconductor storage element according to the embodiment.

Next, as illustrated in FIG. 10, the interlayer insulating films 30 and 40 are formed on the planarization film 20, and the contact 41 is formed on the contact plug 330.

Specifically, by forming $SiO_2$ into a film having a film thickness of 100 nm to 500 nm, using the CVD method or the like, so as to bury the various wires including the wiring layer 31, and then, performing planarization by the CMP method, the interlayer insulating films 30 and 40 are formed.

Subsequently, by etching the interlayer insulating film 40, an opening is formed in a region above the contact plug 330. Next, by forming titanium (Ti) and titanium nitride (TiN) into films by the CVD method or the like, in the opening formed by the etching, and then, further forming tungsten (W) into films, and performing planarization by the CMP method, the contact 41 is formed. Note that, Ti and TiN may be formed into films by the sputtering method or the like that uses the IMP. In addition, planarization may be performed using whole surface etch back in place of the CMP method.

Subsequently, as illustrated in FIG. 11, after the wiring layers 51 and 52 are formed on the interlayer insulating film 40, the interlayer insulating film 50 is formed.

Specifically, various wires including the wiring layers 51 and 52 are formed by wiring material such as copper (Cu), by the damascene method. In addition, by forming $SiO_2$ into a film having a film thickness of 50 nm to 200 nm, using the CVD method or the like, so as to bury the various wires including the wiring layers 51 and 52, the interlayer insulating film 50 is formed.

By being formed on the contact plug 230 of each of the semiconductor storage elements 1, the wiring layer 51 functions as the first bit line BL1 that connects with the other one of the source or the drain of the second transistor T2. In addition, by being formed on the contact plug 330 of each of the semiconductor storage elements 1, the wiring layer 52 functions as the second bit line BL2 that connects with the other one of the source or the drain of the third transistor T3. Note that, the various wires including the wiring layers 51 and 52 may be formed by aluminum (Al) or the like.

Note that, the contact 41, and the wiring layers 51 and 52 may be formed into a dual damascene structure by being simultaneously buried by wiring material such as copper (Cu). In such a case, the wiring layers 51 and 52 can be formed as lower-resistance wires.

According to the above processes, the semiconductor storage element 1 according to the present embodiment can be formed. Note that, in a case where a logic circuit such as a CMOS circuit is formed on the semiconductor substrate 11, wires constituting the CMOS circuit can be simultaneously formed in processes described in FIGS. 9 to 11.

2. Second Embodiment

[2.1. Overview of Semiconductor Storage Element]

Figure 12:
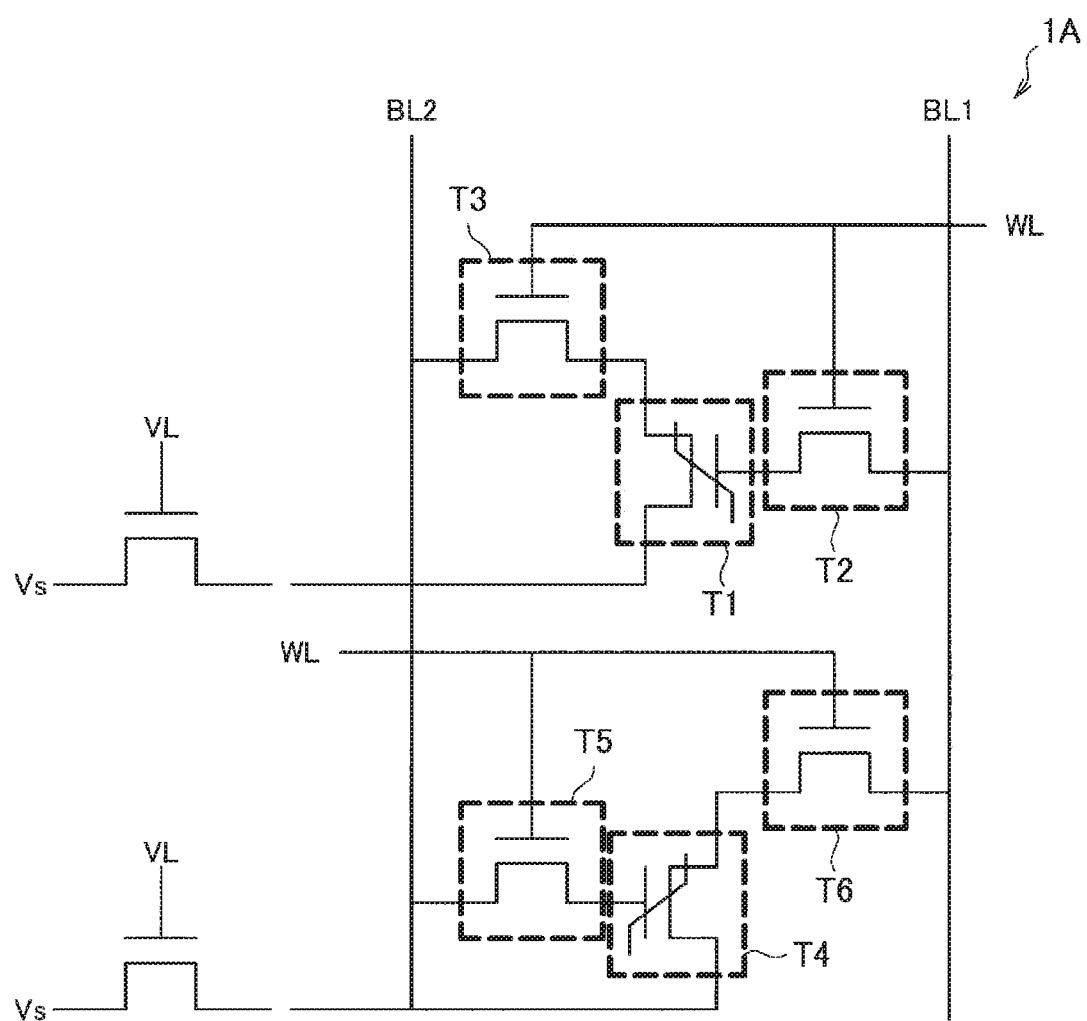
FIG. 12 is a circuit diagram illustrating an equivalent circuit of a semiconductor storage element according to a second embodiment of the present disclosure.

Next, an overview of a semiconductor storage element according to a second embodiment of the present disclosure will be described with reference to FIGS. 12 and 13. FIG. 12 is a circuit diagram illustrating an equivalent circuit of a semiconductor storage element 1A according to the present embodiment.

As illustrated in FIG. 12, the semiconductor storage element 1A according to the present embodiment includes a first transistor T1, a second transistor T2 connecting with a gate of the first transistor T1, and a third transistor T3 connecting with a drain of the first transistor T1, and further includes a fourth transistor T4, a fifth transistor T5 connecting with a gate of the fourth transistor T4, and a sixth transistor T6 connecting with a drain of the fourth transistor T4. Note that, sources of the first and fourth transistors T1 and T4 connect with power sources Vs via external transistors VL of the semiconductor storage element 1A.

Because the configurations of the first to third transistors T1 to T3 are as described in the first embodiment, the description here will be omitted. In addition, the configurations of the fourth to sixth transistors T4 to T6 are substantially similar to the respective configurations of the first to third transistors T1 to T3.

In other words, the semiconductor storage element 1A according to the second embodiment is a storage element that has a structure obtained by combining two structures similar to the semiconductor storage element 1 according to the first embodiment, and stores one piece of information by combination of polarized states in the first and fourth transistors T1 and T4. Accordingly, also in the semiconductor storage element 1A according to the second embodiment, writing and readout of information can be performed without applying voltage to an unselected storage element, similarly to the semiconductor storage element 1 according to the first embodiment. In addition, the semiconductor storage element 1A according to the second embodiment can also suppress degradation in a ferroelectric film forming a gate insulator film.

Subsequently, a schematic structure of the semiconductor storage element 1A having the equivalent circuit illustrated in FIG. 12 will be described with reference to FIG. 13. FIG. 13 is an explanatory diagram schematically illustrating a planar structure of the semiconductor storage element 1A according to the present embodiment.

Figure 13:
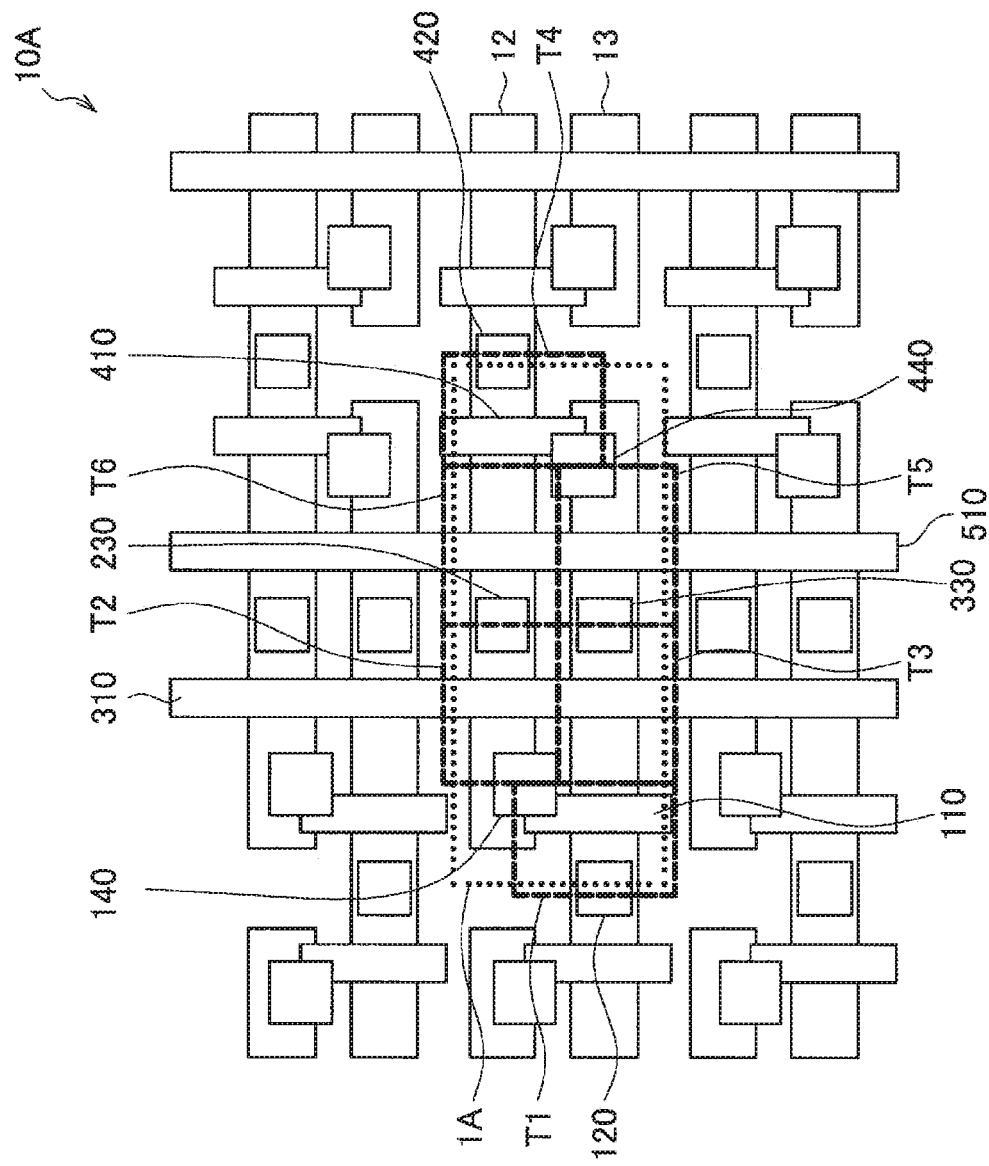
FIG. 13 is an explanatory diagram a schematically illustrating a planar structure of the semiconductor storage element according to the embodiment.

As illustrated in FIG. 13, the semiconductor storage element 1A is provided in a region compartmented by a dotted line in FIG. 13, and the first to sixth transistors T1 to T6 are provided in respective regions compartmented by broken lines.

Here, a planar arrangement of the first to third transistors T1 to T3 in the semiconductor storage element 1A is the same as a planar arrangement of the semiconductor storage element 1 in FIG. 2, and a planar arrangement of the fourth to sixth transistors T4 to T6 is the same as a planar arrangement of a semiconductor storage element adjacent to the semiconductor storage element 1 in FIG. 2. Thus, the first to third transistors T1 to T3 and the fourth to sixth transistors T4 to T6 have planar arrangements symmetric to each other.

The first transistor T1 is formed by providing a gate electrode 110 on an activation region 13 doped to have the second conductivity type. In addition, activation regions 13 sandwiching the gate electrode 110 are doped to have the first conductivity type, and form a drain region and a source region of the first transistor T1.

The source region of the first transistor T1 connects with the external transistor VL (not illustrated) and the power source Vs (not illustrated) via a contact plug 120. The drain region of the first transistor T1 connects with one of a source or drain region of the third transistor T3 in the activation region 13 provided in an extended manner. Furthermore, the gate electrode of the first transistor T1 is extended to an activation region 12 over an insulating element separation region, and connects with one of a source or drain region of the second transistor T2 at a shared contact 140.

The second transistor T2 is formed by providing a gate electrode 310 on an activation region 12 doped to have the second conductivity type. In addition, activation regions 12 sandwiching the gate electrode 310 are doped to have the first conductivity type, and form a drain region and a source region of the second transistor T2.

As described above, one of the source or drain region of the second transistor T2 connects with the gate electrode 110 of the first transistor T1 at the shared contact 140. On the other hand, the other one of the source or drain region of the second transistor T2 connects with the first bit line BL1 via a contact plug 230. In addition, a gate electrode 310 of the second transistor T2 is further extended to another semiconductor storage element over an element separation region, and functions as the word line WL.

The third transistor T3 is formed by providing a gate electrode 310 on an activation region 13 doped to have the second conductivity type. In addition, activation regions 13 sandwiching the gate electrode 310 are doped to have the first conductivity type, and form a drain region and a source region of the third transistor T3.

As described above, one of the source or drain region of the third transistor T3 connects with a source region of a first transistor T3 at the activation region 13 provided in an extended manner. On the other hand, the other one of the source or drain region of the third transistor T3 connects with the second bit line BL2 via a contact plug 330.

The fourth transistor T4 is formed by providing a gate electrode 410 on an activation region 12 doped to have the second conductivity type. In addition, activation regions 12 sandwiching the gate electrode 410 are doped to have the first conductivity type, and form a drain region and a source region of the fourth transistor T4.

The source region of the fourth transistor T4 connects with the external transistor VL (not illustrated) and the power source Vs (not illustrated) via a contact plug 420. The drain region of the fourth transistor T4 connects with one of a source or drain region of the sixth transistor T6 in the activation region 12 provided in an extended manner. Furthermore, the gate electrode of the fourth transistor T4 is extended to an activation region 13 over an insulating element separation region, and connects with one of a source or drain region of the fifth transistor T5 at a shared contact 440.

The fifth transistor T5 is formed by providing a gate electrode 510 on an activation region 13 doped to have the second conductivity type. In addition, activation regions 13 sandwiching the gate electrode 510 are doped to have the first conductivity type, and form a drain region and a source region of the fifth transistor T5.

As described above, one of the source or drain region of the fifth transistor T5 connects with the gate electrode 410 of the fourth transistor T4 at the shared contact 440. On the other hand, the other one of the source or drain region of the fifth transistor T5 connects with the second bit line BL2 via a contact plug 330. In addition, a gate electrode 510 of the fifth transistor T5 is further extended to another semiconductor storage element over an element separation region, and functions as the word line WL.

The sixth transistor T6 is formed by providing a gate electrode 510 on an activation region 12 doped to have the second conductivity type. In addition, activation regions 12 sandwiching the gate electrode 510 are doped to have the first conductivity type, and form a drain region and a source region of the sixth transistor T6.

As described above, one of the source or drain region of the sixth transistor T6 connects with a source region of a fourth transistor T4 at the activation region 12 provided in an extended manner. On the other hand, the other one of the source or drain region of the sixth transistor T6 connects with the first bit line BL1 via a contact plug 230.

By being arranged in a matrix on a semiconductor substrate, for example, a number of semiconductor storage elements 1A each including the first to sixth transistors T1 to T6 as described above functions as a storage device 10A that stores various types of organized information.

In the semiconductor storage element 1A, adjacent semiconductor storage elements are caused to store pieces of information that are symmetric to each other. Specifically, in a case where the information of "0" is stored in the first transistor T1, the information of "1" is stored in the fourth transistor T4. In addition, in a case where the information of "F" is stored in the first transistor T1, the information of "0" is stored in the fourth transistor T4. With this configuration, because the semiconductor storage element 1A stores information by contrasting two semiconductor storage elements, an error as a storage element can be reduced, and reliability of stored information can be enhanced.

In addition, in the semiconductor storage element 1A, one storage element is formed by the adjacent first to sixth transistors T1 to T6 that have small variations in properties that are caused by processes or the like. Thus, in the semiconductor storage element 1A, because variations in properties are suppressed more, and an error as a storage element can be reduced more.

[2.2. Operation of Semiconductor Storage Element]

Subsequently, a writing or readout operation of the semiconductor storage element 1A described in FIGS. 12 and 13 will be described.

Table 2 provided below is a table that shows an example of voltage to be applied to each line in the writing or readout operation of the semiconductor storage element 1A.

TABLE 2

|  | Word line WL | First bit line BL1 | Second bit line BL2 | Gate of transistor VL |
|---|---|---|---|---|
| "1" writing | 3.5 V | 0 V | 3.0 V | 0 V |
| "0" writing | 3.5 V | 3.0 V | 0 V | 0 V |
| Readout | 1.5 V | 1.0 V | 1.0 V | 1.0 V |

As shown in Table 2, in the case of writing information of "1" into the semiconductor storage element 1A, for example, 3.5 V is applied to the word line WL connecting to the selected semiconductor storage element 1A, 0 V is applied to the first bit line BL1, and 3.0 V is applied to the second bit line BL2. In addition, by applying 0 V to a gate of the external transistor VL connecting to the power source Vs, a channel of the external transistor VL is turned off.

At this time, an electric potential of the first bit line BL1 is transmitted to the gate of the first transistor T1 and the drain of the fourth transistor T4 via the second and sixth transistors T2 and T6 having turned-on channels. In addition, an electric potential of the second bit line BL2 is transmitted to the drain of the first transistor T1 and the gate of the fourth transistor T4 via the third and fifth transistors T3 and T5 having turned-on channels.

With this configuration, an external electric field having high electric potential source and drain sides is applied to the gate insulator film of the first transistor T1, and an external electric field having a high electric potential gate side is applied to the gate insulator film of the fourth transistor T4, and polarized states of the gate insulator films are thereby controlled. The semiconductor storage element 1A stores the above states of the first and fourth transistors T1 and T4 as "1".

On the other hand, as shown in Table 2, in the case of writing information of "0" into the semiconductor storage element 1A, for example, 3.5 V is applied to the word line WL connecting to the selected semiconductor storage element 1A, 3.0 V is applied to the first bit line BL1, and 0 V is applied to the second bit line BL2. In addition, by applying 0 V to a gate of the external transistor VL connecting to the power source Vs, a channel of the external transistor VL is turned off.

At this time, an electric potential of the first bit line BL1 is transmitted to the gate of the first transistor T1 and the drain of the fourth transistor T4 via the second and sixth transistors T2 and T6 having turned-on channels. In addition, an electric potential of the second bit line BL2 is transmitted to the drain of the first transistor T1 and the gate of the fourth transistor T4 via the third and fifth transistors T3 and T5 having turned-on channels.

With this configuration, an external electric field having a high electric potential gate side is applied to the gate insulator film of the first transistor T1, and an external electric field having high electric potential source and drain sides is applied to the gate insulator film of the fourth transistor T4, and polarized states of the gate insulator films are thereby controlled. The semiconductor storage element 1A stores the above states of the first and fourth transistors T1 and T4 as "0".

In addition, in the case of reading out information from the semiconductor storage element 1A, as shown in Table 2, 1.5 V is applied to the word line WL connecting to the selected semiconductor storage element 1A, 1.0 V is applied to the first bit line BL1, and 1.0 V is applied to the second bit line BL2. In addition, by applying 1.0 V to the gate of the external transistor VL connecting to the power source Vs, the channel of the external transistor VL is turned on.

At this time, because an electric potential of the first bit line BL1 is transmitted to the gate of the first transistor T1 via the second transistor T2, a channel of the first transistor T1 is turned on. In addition, because an electric potential of the second bit line BL2 is transmitted to the gate of the fourth transistor T4 via the fifth transistor T5, a channel of the fourth transistor T4 is turned on.

Here, in a case where written information is "1", because a threshold voltage Vt of the first transistor T1 becomes high, and a threshold voltage Vt of the fourth transistor T4 becomes low, an electric potential of the first bit line BL1 falls more quickly as compared with an electric potential of the second bit line BL2. With this configuration, because an electric potential to be applied to the gate of the first transistor T1 also falls, an electric potential difference between the first bit line BL1 and the second bit line BL2 becomes further larger. By amplifying such an electric potential difference between the first bit line BL1 and the second bit line BL2, the semiconductor storage element 1A can detect states of the first and fourth transistors T1 and T4, and can determine whether stored information is "1" or "0".

Note that, when information is read out, in a case where leak current that is generated along the first or second bit line BL 1 or 2 is larger than current flowing from the first or second bit line BL 1 or 2 to the power source Vs, determination of stored information has sometimes become difficult. In the semiconductor storage element 1A, because the word line WL can be provided independently of the first and fourth transistor T1 and T4, the leak current of the first and fourth transistor T1 and T4 can be controlled in the word line WL. With this configuration, the semiconductor storage element 1A can perform determination of stored information more surely. Furthermore, by applying a negative word line technique of applying negative voltage to an unselected word line, the semiconductor storage element 1A can also suppress the leak current in the first and fourth transistor T1 and T4 more.

3. Third Embodiment

[3.1. Overview of Semiconductor Storage Element]

Figure 14:
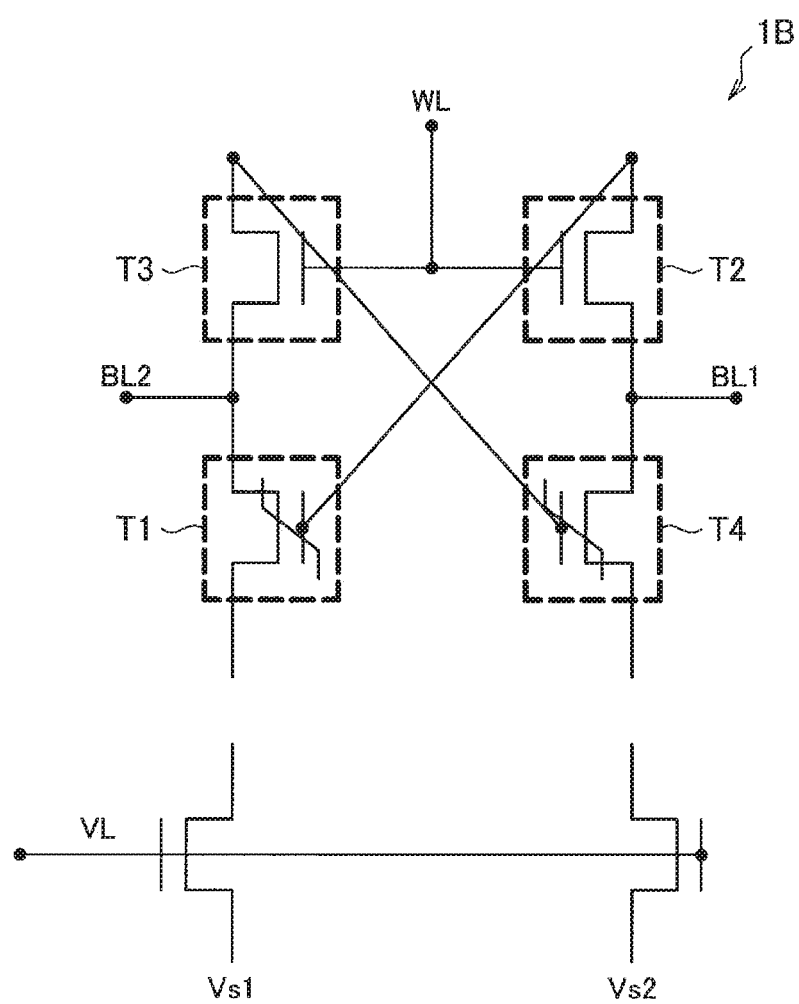
FIG. 14 is a circuit diagram illustrating an equivalent circuit of a semiconductor storage element according to a third embodiment of the present disclosure.

Next, an overview of a semiconductor storage element according to a third embodiment of the present disclosure will be described with reference to FIGS. 14 and 15. FIG. 14 is a circuit diagram illustrating an equivalent circuit of a semiconductor storage element 1B according to the present embodiment.

As illustrated in FIG. 14, the semiconductor storage element 1B according to the present embodiment includes a first transistor T1, a second transistor T2 connecting with a gate of the first transistor T1, and a third transistor T3 connecting with a drain of the first transistor T1, and further includes a fourth transistor T4 connecting with the second transistor T2 at a drain, and connecting with the third transistor T3 at a gate. Note that, sources of the first and fourth transistors T1 and T4 connect with power sources Vs1 and Vs2 via an external transistor VL of the semiconductor storage element 1B.

Because the configurations of the first to third transistors T1 to T3 are as described in the first embodiment, the description here will be omitted. In addition, the fourth transistor T4 is a field effect transistor that includes a gate insulator film at least partially formed by ferroelectric material, and can store information in direction of residual polarization of the gate insulator film.

In other words, similarly to the semiconductor storage element 1A according to the second embodiment, the semiconductor storage element 1B according to the third embodiment is a storage element that stores one piece of information by combination of polarized states in the first and fourth transistors T1 and T4. Because the semiconductor storage element 1B according to the third embodiment stores information by contrasting two semiconductor storage elements, similarly to the semiconductor storage element 1A according to the second embodiment, an error as a storage element can be reduced, and reliability of stored information can be enhanced.

In addition, in the semiconductor storage element 1B according to the third embodiment, the second and third transistors T2 and T3 functioning as switching elements are respectively connected to the first and fourth transistors T1 and T4 that store information. Accordingly, the semiconductor storage element 1B can selectively apply an external electric field to the gate insulator films of the first and fourth transistors T1 and T4. With this configuration, the semiconductor storage element 1B can prevent information stored in an unselected semiconductor storage element, from being deranged, when information is written into or read out from the selected semiconductor storage element 1B. In addition, the semiconductor storage element 1B according to the third embodiment can also suppress degradation in a ferroelectric film forming the gate insulator films.

Subsequently, a schematic structure of the semiconductor storage element 1B having the equivalent circuit illustrated in FIG. 14 will be described with reference to FIG. 15. FIG. 15 is an explanatory diagram schematically illustrating a planar structure of the semiconductor storage element 1B according to the present embodiment.

Figure 15:
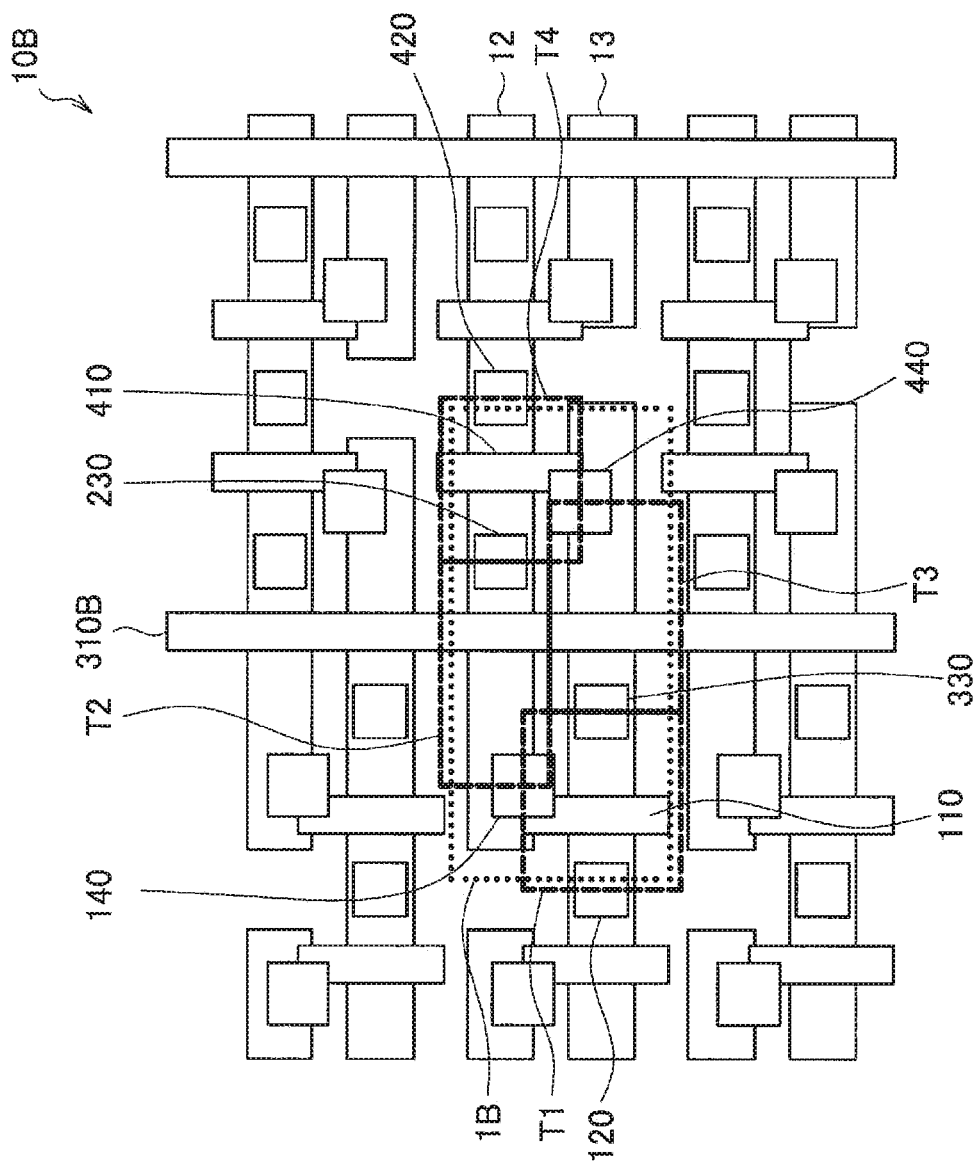
FIG. 15 is an explanatory diagram a schematically illustrating a planar structure of the semiconductor storage element according to the embodiment.

As illustrated in FIG. 15, the semiconductor storage element 1B is provided in a region compartmented by a dotted line in FIG. 15, and the first to fourth transistors T1 to T4 are provided in respective regions compartmented by broken lines.

The first transistor T1 is formed by providing a gate electrode 110 on an activation region 13 doped to have the second conductivity type. In addition, activation regions 13 sandwiching the gate electrode 110 are doped to have the first conductivity type, and form a drain region and a source region of the first transistor T1.

The source region of the first transistor T1 connects with the external transistor VL (not illustrated) and the power source Vs1 (not illustrated) via a contact plug 120. The drain region of the first transistor T1 connects with one of a source or drain region of the third transistor T3 in the activation region 13 provided in an extended manner, and connects with the second bit line BL2 via the contact plug 330. Furthermore, the gate electrode of the first transistor T1 is extended to an activation region 12 over an insulating element separation region, and connects with one of a source or drain region of the second transistor T2 at a shared contact 140.

The second transistor T2 is formed by providing a gate electrode 310B on an activation region 12 doped to have the second conductivity type. In addition, activation regions 12 sandwiching the gate electrode 310B are doped to have the first conductivity type, and form a drain region and a source region of the second transistor T2.

As described above, one of the source or drain region of the second transistor T2 connects with the gate electrode 110 of the first transistor T1 at the shared contact 140. On the other hand, the other one of the source or drain region of the second transistor T2 connects with a drain region of the fourth transistor T4 in the activation region 12 provided in an extended manner, and connects with the first bit line BL1 via a contact plug 230. In addition, a gate electrode 310 of the second transistor T2 is further extended to another semiconductor storage element over an element separation region, and functions as the word line WL.

The third transistor T3 is formed by providing a gate electrode 310B on an activation region 13 doped to have the second conductivity type. In addition, activation regions 13 sandwiching the gate electrode 310B are doped to have the first conductivity type, and form a drain region and a source region of the third transistor T3.

One of a source or drain region of the third transistor T3 connects with the gate electrode 410 of the fourth transistor T4 at the shared contact 440. On the other hand, as described above, the other one of the source or drain region of the third transistor T3 connects with a source region of a first transistor T3 at the activation region 13 provided in an extended manner, and connects with the second bit line BL2 via the contact plug 330.

The fourth transistor T4 is formed by providing a gate electrode 410 on an activation region 12 doped to have the second conductivity type. In addition, activation regions 12 sandwiching the gate electrode 410 are doped to have the first conductivity type, and form a drain region and a source region of the fourth transistor T4.

The source region of the fourth transistor T4 connects with the external transistor VL (not illustrated) and the power source Vs2 (not illustrated) via a contact plug 420. The drain region of the fourth transistor T4 connects with one of a source or drain region of the second transistor T2 in the activation region 12 provided in an extended manner, and connects with the first bit line BL1 via the contact plug 230. Furthermore, the gate electrode of the fourth transistor T4 is extended to an activation region 13 over an insulating element separation region, and connects with one of a source or drain region of the third transistor T3 at a shared contact 440.

By being arranged in a matrix on a semiconductor substrate, for example, a number of semiconductor storage elements 1B each including the first to fourth transistors T1 to T4 as described above functions as a storage device 10B that stores various types of organized information.

In other words, the semiconductor storage element 1B according to the third embodiment mainly differs in that two gate electrodes functioning as the word line WL are brought together into the one gate electrode 310B, as compared with the semiconductor storage element 1A according to the second embodiment. Accordingly, in the semiconductor storage element 1B, two field effect transistors (T2 and T6, and T3 and T6) formed respectively corresponding to the gate electrodes 310 and 510 in the semiconductor storage element 1A are brought together into one field effect transistor (T2 and T3) formed corresponding to the gate electrode 310B. In addition, in accordance with this, the contact plugs 230 and 330 are provided on sides opposite to each other across the gate electrode 310B.

In the semiconductor storage element 1B, the first and fourth transistors T1 and T4 are caused to store pieces of information that are symmetric to each other. Specifically, in a case where the information of "0" is stored in the first transistor T1, the information of "1" is stored in the fourth transistor T4. In addition, in a case where the information of "1" is stored in the first transistor T1, the information of "0" is stored in the fourth transistor T4. With this configuration, because the semiconductor storage element 1B stores information by contrasting two semiconductor storage elements, an error as a storage element can be reduced, and reliability of stored information can be enhanced.

In addition, in the semiconductor storage element 1B, one storage element is formed by the adjacent first to fourth transistors T1 to T4 that have small variations in properties that are caused by processes or the like. Thus, in the semiconductor storage element 1B, because variations are suppressed more, and an error can be reduced more.

Furthermore, the number of field effect transistors being structural elements in the semiconductor storage element 1B according to the third embodiment is smaller by two than that of the semiconductor storage element 1A according to the second embodiment. Accordingly, the semiconductor storage element 1B according to the third embodiment can form one storage element in a smaller planar area. With this configuration, because an integration degree of the semiconductor storage elements 1B can be enhanced, storage density of the storage device 10B in which the semiconductor storage elements 1B are integrated can be enhanced.

[3.2. Operation of Semiconductor Storage Element]

Subsequently, a writing or readout operation of the semiconductor storage element 1B described in FIGS. 14 and 15 will be described.

Table 3 provided below is a table that shows an example of voltage to be applied to each line in the writing or readout operation of the semiconductor storage element 1B.

TABLE 3

| | Word line WL | First bit line BL1 | Second bit line BL2 | Gate of transistor VL |
|---|---|---|---|---|
| "1" writing | 3.5 V | 0 V | 3.0 V | 0 V |
| "0" writing | 3.5 V | 3.0 V | 0 V | 0 V |
| Readout | 1.5 V | 1.0 V | 1.0 V | 1.0 V |

As shown in Table 3, in the case of writing information of "1" into the semiconductor storage element 1B, for example, 3.5 V is applied to the word line WL connecting to the selected semiconductor storage element 1B, 0 V is applied to the first bit line BL1, and 3.0 V is applied to the second bit line BL2. In addition, by applying 0 V to a gate of the external transistor VL connecting to the power source Vs, a channel of the external transistor VL is turned off.

At this time, an electric potential of the first bit line BL1 is transmitted to the gate of the first transistor T1 via the second transistor T2 having the turned-on channel, and to the drain of the fourth transistor T4 directly connecting thereto. In addition, an electric potential of the second bit line BL2 is transmitted to the drain of the first transistor T1 via the third transistor T3 having the turned-on channel, and to the gate of the fourth transistor T4 directly connecting thereto.

With this configuration, an external electric field having high electric potential source and drain sides is applied to the gate insulator film of the first transistor T1, and an external electric field having a high electric potential gate side is applied to the gate insulator film of the fourth transistor T4, and polarized states of the gate insulator films are thereby controlled. The semiconductor storage element 1B stores the above states of the first and fourth transistors T1 and T4 as "1".

On the other hand, as shown in Table 3, in the case of writing information of "0" into the semiconductor storage element 1B, for example, 3.5 V is applied to the word line WL connecting to the selected semiconductor storage element 1B, 3.0 V is applied to the first bit line BL1, and 0 V is applied to the second bit line BL2. In addition, by applying 0 V to a gate of the external transistor VL connecting to the power source Vs, a channel of the external transistor VL is turned off.

At this time, an electric potential of the first bit line BL1 is transmitted to the gate of the first transistor T1 and the drain of the directly connected fourth transistor T4 via the second transistor T2 having turned-on channels. In addition, an electric potential of the second bit line BL2 is transmitted to the drain of the first transistor T1 and the gate of the directly connected fourth transistor T4 via the third transistor T3 having turned-on channels.

With this configuration, an external electric field having a high electric potential gate side is applied to the gate insulator film of the first transistor T1, and an external electric field having high electric potential source and drain sides is applied to the gate insulator film of the fourth transistor T4, and polarized states of the gate insulator films are thereby controlled. The semiconductor storage element 1B stores the above states of the first and fourth transistors T1 and T4 as "0".

In addition, in the case of reading out information from the semiconductor storage element 1B, as shown in Table 3, 1.5 V is applied to the word line WL connecting to the selected semiconductor storage element 1B, 1.0 V is applied to the first bit line BL1, and 1.0 V is applied to the second bit line BL2. In addition, by applying 1.0 V to the gate of the external transistor VL connecting to the power source Vs, the channel of the external transistor VL is turned on.

At this time, because an electric potential of the first bit line BL1 is transmitted to the gate of the first transistor T1 via the second transistor T2, a channel of the first transistor T1 is turned on. In addition, because an electric potential of the second bit line BL2 is transmitted to the gate of the fourth transistor T4 via the third transistor T3, a channel of the fourth transistor T4 is turned on.

Here, in a case where written information is "1", because a threshold voltage Vt of the first transistor T1 becomes high, and a threshold voltage Vt of the fourth transistor T4 becomes low, an electric potential of the first bit line BL1 falls more quickly as compared with an electric potential of the second bit line BL2. With this configuration, because an electric potential to be applied to the gate of the first transistor T1 also falls, an electric potential difference between the first bit line BL1 and the second bit line BL2 becomes further larger. By amplifying such an electric potential difference between the first bit line BL1 and the second bit line BL2, the semiconductor storage element 1B can detect states of the first and fourth transistors T1 and T4, and can determine whether stored information is "1" or "0".

Note that, when information is read out, in a case where leak current that is generated along the first or second bit line BL 1 or 2 is larger than current flowing from the first or second bit line BL 1 or 2 to the power source Vs, determination of stored information has sometimes become difficult. In the semiconductor storage element 1B, because the word line WL can be provided independently of the first and fourth transistor T1 and T4, the leak current of the first and fourth transistor T1 and T4 can be controlled in the word line WL. With this configuration, the semiconductor storage element 1B can perform determination of stored information more surely. Furthermore, by applying a negative word line technique of applying negative voltage to an unselected word line, the semiconductor storage element 1B can also suppress the leak current in the first and fourth transistor T1 and T4 more.

4. Conclusion

As described above, according to the semiconductor storage element 1 according to an embodiment of the present disclosure, the second and third transistors T2 and T3 functioning as switching elements are respectively connected to the gate and the drain of the first transistor T1 that stores information. Accordingly, because the semiconductor storage element 1 can selectively apply an external electric field to the gate insulator film of the first transistor T1, information stored in an unselected semiconductor storage element can be prevented from being rewritten, when information is written into the selected semiconductor storage element 1.

In addition, according to the semiconductor storage element 1 according to an embodiment of the present disclosure, a semiconductor storage element having the above-described equivalent circuit can be formed in a smaller planar area. With this configuration, because the semiconductor storage element 1 according to an embodiment of the present disclosure can enhance an integration degree of storage elements, it is possible to enhance storage density of the storage device 10 in which the semiconductor storage elements 1 are integrated.

Furthermore, in the semiconductor storage elements 1A and 1B according to the second and third embodiments of the present disclosure, one piece of information is stored by a combination of polarized states in the first and fourth transistors T1 and T4. With this configuration, because the semiconductor storage elements 1A and 1B can store information by contrasting two semiconductor storage elements, an error as a storage element can be reduced, and reliability of stored information can be enhanced.

In addition, according to the semiconductor storage elements 1A and 1B, neighboring field effect transistors having small variations in properties that are caused by processes or the like can be used as the first and fourth transistors T1 and T4. Accordingly, in the semiconductor storage elements 1A and 1B, variations in properties can be further suppressed, and an error as a storage element can be further reduced.

Furthermore, according to the present disclosure, an electronic device including the storage device including any of the semiconductor storage element according to the first to third embodiments can also be provided. As such an electronic device, for example, a personal computer, various display devices such as a liquid crystal display device and an organic electroluminescence display device, a mobile phone, a smartphone, a game device, an Internet of Things (IoT) device, and the like can be exemplified.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A semiconductor storage element including:

a first transistor including a gate insulator film at least partially formed by ferroelectric material;

a second transistor connecting with a gate of the first transistor at one of a source or a drain; and a third transistor connecting with a drain of the first transistor at one of a source or a drain, in which the semiconductor storage elements are arranged in a matrix, and each of the second and third transistors connects with a word line at a gate, and connects with a bit line at another one of the source or the drain.

(2)

The semiconductor storage element according to (1), in which the second and third transistors include a gate insulator film at least partially formed by ferroelectric material.

(3)

The semiconductor storage element according to (1) or (2), in which the first to third transistors are transistors of a same conductivity type.

(4)

The semiconductor storage element according to any one of (1) to (3), in which the first to third transistors are first conductivity type transistors, and a channel region of the first transistor is a first conductivity type region having lower concentration than a source region or a drain region.

(5)

The semiconductor storage element according to any one of (1) to (4), in which a gate electrode of the first transistor is separately provided for each semiconductor storage element, and a gate electrode of the second and third transistors is provided in common over a plurality of semiconductor storage elements.

(6)

The semiconductor storage element according to any one of (1) to (5), in which the bit line includes a first bit line and a second bit line corresponding to the first bit line, and the first bit line connects with another one of the source or the drain of the second transistor, and the second bit line connects with another one of the source or the drain of the third transistor.

(7)

The semiconductor storage element according to any one of (1) to (6), in which a shared contact that connects the first transistor and the second transistor is provided on a gate electrode of the first transistor, and one of a source region or a drain region of the second transistor.

(8)

The semiconductor storage element according to any one of (1) to (8), further including:

a fourth transistor including a gate insulator film at least partially formed by ferroelectric material;

a fifth transistor connecting with a gate of the fourth transistor at one of a source or a drain; and a sixth transistor connecting with a drain of the fourth transistor at one of a source or a drain, in which each of the fifth and sixth transistors connects with the word line at a gate, and connects with the bit line at another one of the source or the drain.

(9)
The semiconductor storage element according to (8), in which directions of residual polarization of gate insulator films of the first transistor and the fourth transistor are directions opposite to each other.

(10)
The semiconductor storage element according to (8) or (9), in which the first to third transistors and the fourth to sixth transistors are provided in planar arrangements symmetric to each other.

(11)
The semiconductor storage element according to any one of (8) to (10), in which gate electrodes of the first and fourth transistors are separately provided for each semiconductor storage element, and a gate electrode of the second and third transistors and a gate electrode of the fifth and sixth transistors are provided in common over a plurality of semiconductor storage elements.

(12)
The semiconductor storage element according to any one of (8) to (11), in which the bit line includes a first bit line and a second bit line corresponding to the first bit line, and the first bit line connects with another one of the sources or the drains of the second and sixth transistors, and the second bit line connects with another one of the sources or the drains of the third and fifth transistors.

(13)
The semiconductor storage element according to (12), in which the first bit line and the second and sixth transistors are connected by a common contact plug, and the second bit line and the third and fifth transistors are connected by a common contact plug.

(14)
A semiconductor storage element including:

a first transistor and a fourth transistor including gate insulator films at least partially formed by ferroelectric material;

a second transistor connecting with a gate of the first transistor at one of a source or a drain, and connecting with a drain of the fourth transistor at another one of the source or the drain; and a third transistor connecting with a gate of the fourth transistor at one of a source or a drain, and connecting with a drain of the first transistor at another one of the source or the drain, in which the semiconductor storage elements are arranged in a matrix, and each of the second and third transistors connects with a word line at a gate, and connects with a bit line at another one of the source or the drain.

(15)
The semiconductor storage element according to (14), in which directions of residual polarization of the gate insulator films of the first transistor and the fourth transistor are directions opposite to each other.

(16)
The semiconductor storage element according to (14) or (15), in which a gate electrode of the fourth transistor is separately provided for each semiconductor storage element.

(17)
The semiconductor storage element according to any one of (14) to (16), in which the bit line includes a first bit line and a second bit line corresponding to the first bit line, and the first bit line connects with the drain of the fourth transistor and one of the source or the drain of the second transistor, and the second bit line connects with the drain of the first transistor and one of the source or the drain of the third transistor.

(18)
The semiconductor storage element according to (17), in which the first bit line and the second and fourth transistors are connected by a common contact plug.

(19)
The semiconductor storage element according to any one of (14) to (18), in which a shared contact that connects the third transistor and the fourth transistor is provided on a gate electrode of the fourth transistor, and one of a source region or a drain region of the third transistor.

(20)
An electronic device including:
semiconductor storage elements each including
a first transistor including a gate insulator film at least partially formed by ferroelectric material,
a second transistor connecting with a gate of the first transistor at one of a source or a drain, and
a third transistor connecting with a drain of the first transistor at one of a source or a drain,
the semiconductor storage elements being arranged in a matrix,
in which each of the second and third transistors of the semiconductor storage element connects with a word line at a gate, and connects with a bit line at another one of the source or the drain.

REFERENCE SIGNS LIST 1, 1A, 1B semiconductor storage element
10, 10A, 10B storage device
11 semiconductor substrate
11B element separation region
12, 13 activation region
110, 310, 410, 510 gate electrode
111 first gate insulator film
120, 230, 330, 420 contact plug
121 first source region
131 first drain region
140, 440 shared contact
221 second source/drain region
311 third gate insulator film
331 third source/drain region
T1 first transistor
T2 second transistor
T3 third transistor
T4 fourth transistor
T5 fifth transistor
T6 sixth transistor
WL word line
BL1 first bit line
BL2 second bit line

The invention claimed is:
1. A semiconductor storage element, comprising:
a first transistor including a first gate insulator film, wherein the first gate insulator film includes a ferroelectric material;

a second transistor, wherein one of a source of the second transistor or a drain of the second transistor is connected with a gate of the first transistor; and a third transistor, wherein one of a source of the third transistor or a drain of the third transistor is connected with a drain of the first transistor, wherein a plurality of semiconductor storage elements, including the semiconductor storage element, is arranged in a matrix, a gate electrode of the first transistor is different for each semiconductor storage element of the plurality of semiconductor storage elements, a gate electrode of each of the second transistor and the third transistor is common for the plurality of semiconductor storage elements, a gate of each of the second transistor and the third transistor is connected with a word line, other of the one of the source of the second transistor or the drain of the second transistor is connected with a first bit line, and other of the one of the source of the third transistor or the drain of the third transistor is connected with a second bit line.

2. The semiconductor storage element according to claim 1, wherein
the second transistor includes a second gate insulator film, the third transistor includes a third gate insulator film, and
each of the second gate insulator film and the third gate insulator film includes the ferroelectric material.

3. The semiconductor storage element according to claim 1, wherein a conductivity type of each of the first transistor, the second transistor, and the third transistor is same.

4. The semiconductor storage element according to claim 3, wherein
each of the first transistor, the second transistor, and the third transistor is a first conductivity type transistor, and
a channel region of the first transistor has a lower concentration than at least one of a source region of the first transistor or a drain region of the first transistor.

5. The semiconductor storage element according to claim 1, wherein
a shared contact connects the first transistor with the second transistor, and
the shared contact is on the gate electrode of the first transistor, and on one of a source region of the second transistor or a drain region of the second transistor.

6. The semiconductor storage element according to claim 1, further comprising:
a fourth transistor including a second gate insulator film, wherein the second gate insulator film includes the ferroelectric material;
a fifth transistor, wherein one of a source of the fifth transistor or a drain of the fifth transistor is connected with a gate of the fourth transistor; and
a sixth transistor, wherein one of a source of the sixth transistor or a drain of the sixth transistor is connected with a drain of the fourth transistor, wherein
a gate of each of the fifth transistor and the sixth transistor is connected with the word line,
other of the one of the source of the fifth transistor or the drain of the fifth transistor is connected with the second bit line, and other of the one of the source of the sixth transistor or the drain of the sixth transistor is connected with the first bit line.

7. The semiconductor storage element according to claim 6, wherein a direction of residual polarization of the first gate insulator film is opposite to a direction of the residual polarization of the second gate insulator film.

8. The semiconductor storage element according to claim 6, wherein the first transistor, the second transistor, and the third transistor are in a planar arrangement symmetric to a planar arrangement of the fourth transistor, the fifth transistor, and the sixth transistor.

9. The semiconductor storage element according to claim 6, wherein
a gate electrode of the fourth transistor is different for each semiconductor storage element of the plurality of semiconductor storage elements, and
a gate electrode of each of the fifth transistor and the sixth transistor is common for the plurality of semiconductor storage elements.

10. The semiconductor storage element according to claim 6, wherein
the first bit line is connected to the second transistor and the sixth transistor by a first common contact plug, and
the second bit line is connected to the third transistor and the fifth transistor by a second common contact plug.

11. A semiconductor storage element, comprising:
a first transistor including a first gate insulator film, wherein the first gate insulator film includes a ferroelectric material;
a fourth transistor including a second gate insulator film, wherein the second gate insulator film includes the ferroelectric material;
a second transistor, wherein
one of a source of the second transistor or a drain of the second transistor is connected with a gate of the first transistor, and
other of the one of the source of the second transistor or the drain of the second transistor is connected with a drain of the fourth transistor; and
a third transistor, wherein
one of a source of the third transistor or a drain of the third transistor is connected with a gate of the fourth transistor,
other of the one of the source of the third transistor or the drain of the third transistor is connected with a drain of the first transistor,
a plurality of semiconductor storage elements, including the semiconductor storage element, is arranged in a matrix,
a gate of each of the second transistor and the third transistor is connected with a word line,
the other of the one of the source of the second transistor or the drain of the second transistor is connected with a first bit line, and
the other of the one of the source of the third transistor or the drain of the third transistor is connected with a second bit line.

12. The semiconductor storage element according to claim 11, wherein a direction of residual polarization of the first gate insulator film is opposite to a direction of the residual polarization of the second gate insulator film.

13. The semiconductor storage element according to claim 11, wherein a gate electrode of the fourth transistor is different for each semiconductor storage element of the plurality of semiconductor storage elements.

14. The semiconductor storage element according to claim 11, wherein
the first bit line is connected with the drain of the fourth transistor, and
the second bit line is connected with the drain of the first transistor.

15. The semiconductor storage element according to claim 14, wherein the first bit line is connected to each of the second transistor and the fourth transistor by a common contact plug.

16. The semiconductor storage element according to claim 11, wherein
a shared contact connects the third transistor with the fourth transistor, and
the shared contact is on a gate electrode of the fourth transistor, and one of a source region of the third transistor or a drain region of the third transistor.

17. An electronic device, comprising:
a plurality of semiconductor storage elements, wherein each semiconductor storage element of the plurality of semiconductor storage elements includes:
a first transistor including a gate insulator film, wherein the gate insulator film includes a ferroelectric material;
a second transistor, wherein one of a source of the second transistor or a drain of the second transistor is connected with a gate of the first transistor; and
a third transistor, wherein
one of a source of the third transistor or a drain of the third transistor is connected with a drain of the first transistor,
the plurality of semiconductor storage elements is arranged in a matrix,
a gate electrode of the first transistor is different for each semiconductor storage element of the plurality of semiconductor storage elements,
a gate electrode of each of the second transistor and the third transistor is common for the plurality of semiconductor storage elements,
a gate of each of the second transistor and the third transistor is connected with a word line,
other of the one of the source of the second transistor or the drain of the second transistor is connected with a first bit line, and
other of the one of the source of the third transistor or the drain of the third transistor is connected with a second bit line.

* * * * *